(12) United States Patent
Eid et al.

(10) Patent No.: US 11,302,618 B2
(45) Date of Patent: Apr. 12, 2022

(54) MICROELECTRONIC ASSEMBLIES HAVING SUBSTRATE-INTEGRATED PEROVSKITE LAYERS

(71) Applicant: Intel Corporation, Santa Clara, CA (US)

(72) Inventors: Feras Eid, Chandler, AZ (US); Shawna M. Liff, Scottsdale, AZ (US); Thomas Sounart, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 15/948,803

(22) Filed: Apr. 9, 2018

(65) Prior Publication Data

US 2019/0311980 A1 Oct. 10, 2019

(51) Int. Cl.
*H01G 4/00* (2006.01)
*H01L 23/498* (2006.01)
(Continued)

(52) U.S. Cl.
CPC ....... *H01L 23/49838* (2013.01); *H01G 4/008* (2013.01); *H01G 4/1227* (2013.01);
(Continued)

(58) Field of Classification Search
CPC . H01L 23/49838; H01L 23/367; H01L 41/09; H01L 41/1132; H01L 2924/19041; H01L 2924/1517; H01L 2924/1511; H01L 2224/131; H01L 24/13; H01L 23/49866; H01L 41/094; H01L 41/1136; H01L 41/332; H01L 41/23; H01L 41/25; H01L 41/253; H01L 41/053; H01L 41/187; H01L 41/081; H01L 41/0478; H01L 21/4857; H01L 41/047; H01L 23/49827; H01L 23/49822; H01L 41/1871; H01L 41/1873; H01L 41/0533; H01L 41/29; H01L 41/314; H01L 29/16; H01L 41/1876; H01L 23/145; H01L 2924/19102; H01L 24/16; H01L 2224/16227; H01G 4/33; H01G 4/008; H01G 4/30; H01G 4/1227; H01G 4/1245;
(Continued)

(56) References Cited

U.S. PATENT DOCUMENTS 5,986,301 A 11/1999 Fukushima et al.
6,151,240 A * 11/2000 Suzuki .................... H01L 28/55
257/295

(Continued)

*Primary Examiner* — Steven T Sawyer
(74) *Attorney, Agent, or Firm* — Patent Capital Group

(57) ABSTRACT

Disclosed herein are microelectronic assemblies with integrated perovskite layers, and related devices and methods. For example, in some embodiments, a microelectronic assembly may include an organic package substrate portion having a surface with a conductive layer, and a perovskite conductive layer on the conductive layer. In some embodiments, a microelectronic assembly may include an organic package substrate portion having a surface with a conductive layer, a perovskite conductive layer having a first crystalline structure on the conductive layer, and a perovskite dielectric layer having a second crystalline structure on the perovskite conductive layer. In some embodiments, the first and second crystalline structures have a same orientation.

20 Claims, 15 Drawing Sheets

(51) Int. Cl.
| | |
|---|---|
| H01G 4/008 | (2006.01) |
| H05K 1/16 | (2006.01) |
| H01G 4/30 | (2006.01) |
| H01L 21/48 | (2006.01) |
| H05K 1/18 | (2006.01) |
| H01L 41/047 | (2006.01) |
| H01G 4/12 | (2006.01) |
| H01L 41/187 | (2006.01) |
| H01L 41/053 | (2006.01) |
| H01L 41/29 | (2013.01) |
| H01L 41/314 | (2013.01) |
| H01L 29/16 | (2006.01) |
| H01L 23/14 | (2006.01) |
| H01L 23/00 | (2006.01) |
| H05K 1/11 | (2006.01) |
| H01L 23/367 | (2006.01) |
| H01L 41/09 | (2006.01) |
| H01L 41/113 | (2006.01) |

(52) U.S. Cl.
CPC ......... *H01G 4/1245* (2013.01); *H01G 4/1254* (2013.01); *H01G 4/30* (2013.01); *H01L 21/4857* (2013.01); *H01L 23/145* (2013.01); *H01L 23/49822* (2013.01); *H01L 23/49827* (2013.01); *H01L 29/16* (2013.01); *H01L 41/047* (2013.01); *H01L 41/0533* (2013.01); *H01L 41/1871* (2013.01); *H01L 41/1873* (2013.01); *H01L 41/1876* (2013.01); *H01L 41/29* (2013.01); *H01L 41/314* (2013.01); *H05K 1/162* (2013.01); *H05K 1/181* (2013.01); *H01L 23/367* (2013.01); *H01L 24/16* (2013.01); *H01L 41/09* (2013.01); *H01L 41/1132* (2013.01); *H01L 2224/16227* (2013.01); *H01L 2924/19041* (2013.01); *H01L 2924/19102* (2013.01); *H05K 1/111* (2013.01); *H05K 2201/10151* (2013.01); *H05K 2201/10378* (2013.01); *H05K 2201/10734* (2013.01)

(58) Field of Classification Search
CPC ....... H01G 4/1254; H05K 2201/10734; H05K 1/111; H05K 2201/10378; H05K 2201/10151; H05K 1/162; H05K 1/181; B81C 1/00333; B81B 2201/032; B81B 3/0021

See application file for complete search history.

(56) References Cited

U.S. PATENT DOCUMENTS

| | | |
|---|---|---|
| 6,924,519 B2 | 8/2005 | Itokawa et al. |
| 7,453,144 B2 | 11/2008 | Palanduz |
| 2003/0011960 A1 | 1/2003 | Koning et al. |
| 2005/0213020 A1* | 9/2005 | Takeda ................ H01L 41/29 349/182 |
| 2016/0055976 A1 | 2/2016 | Song et al. |

* cited by examiner

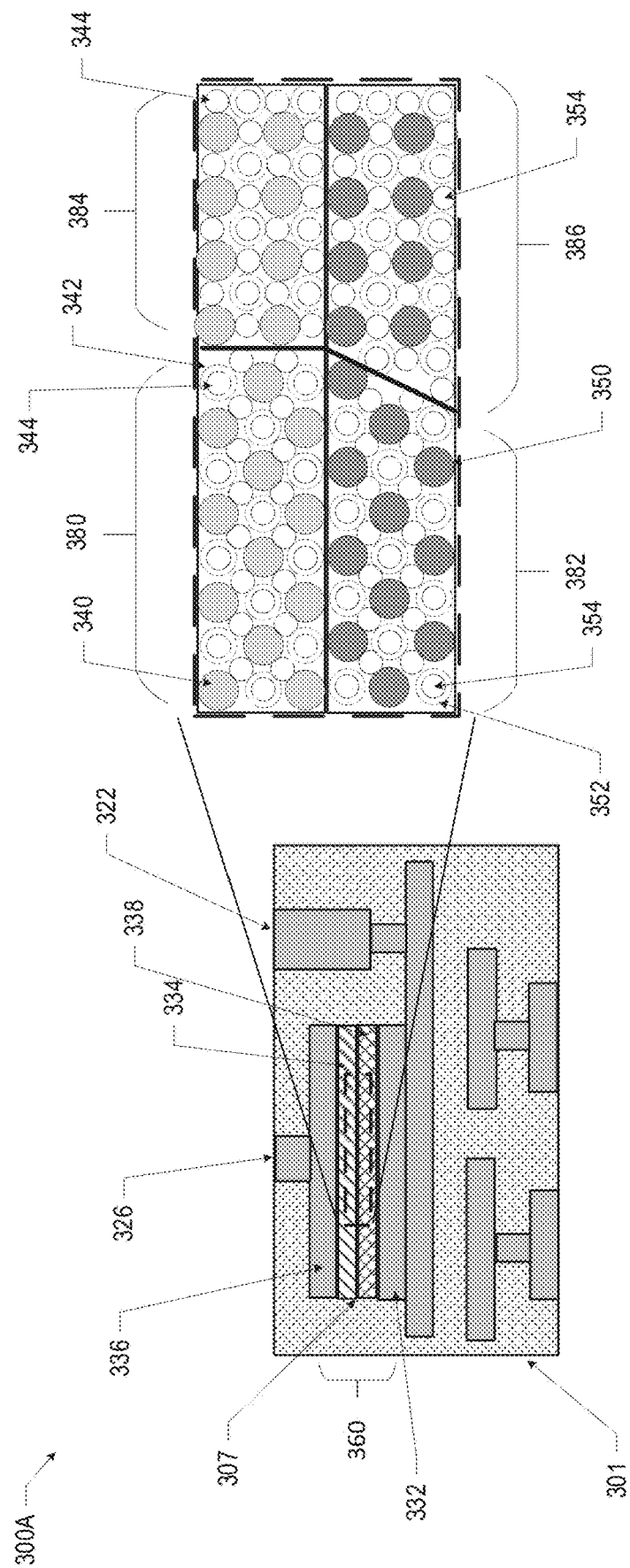

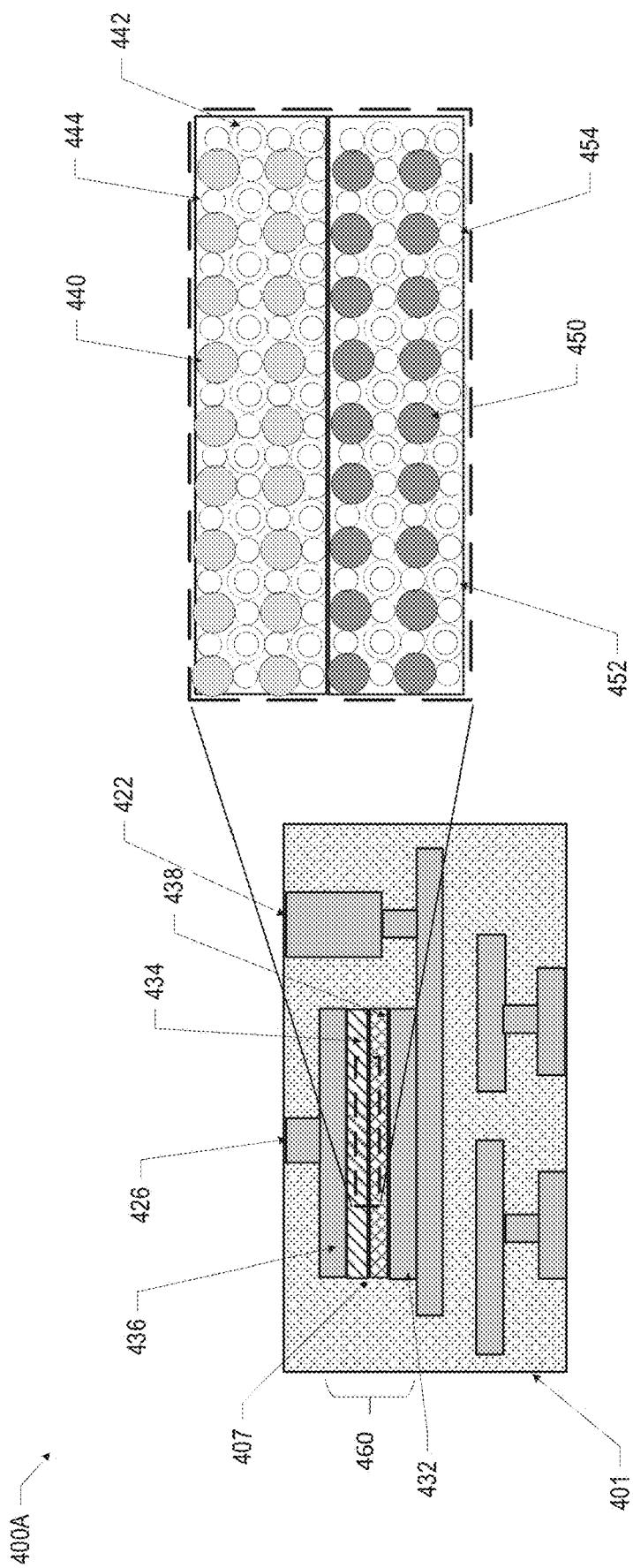

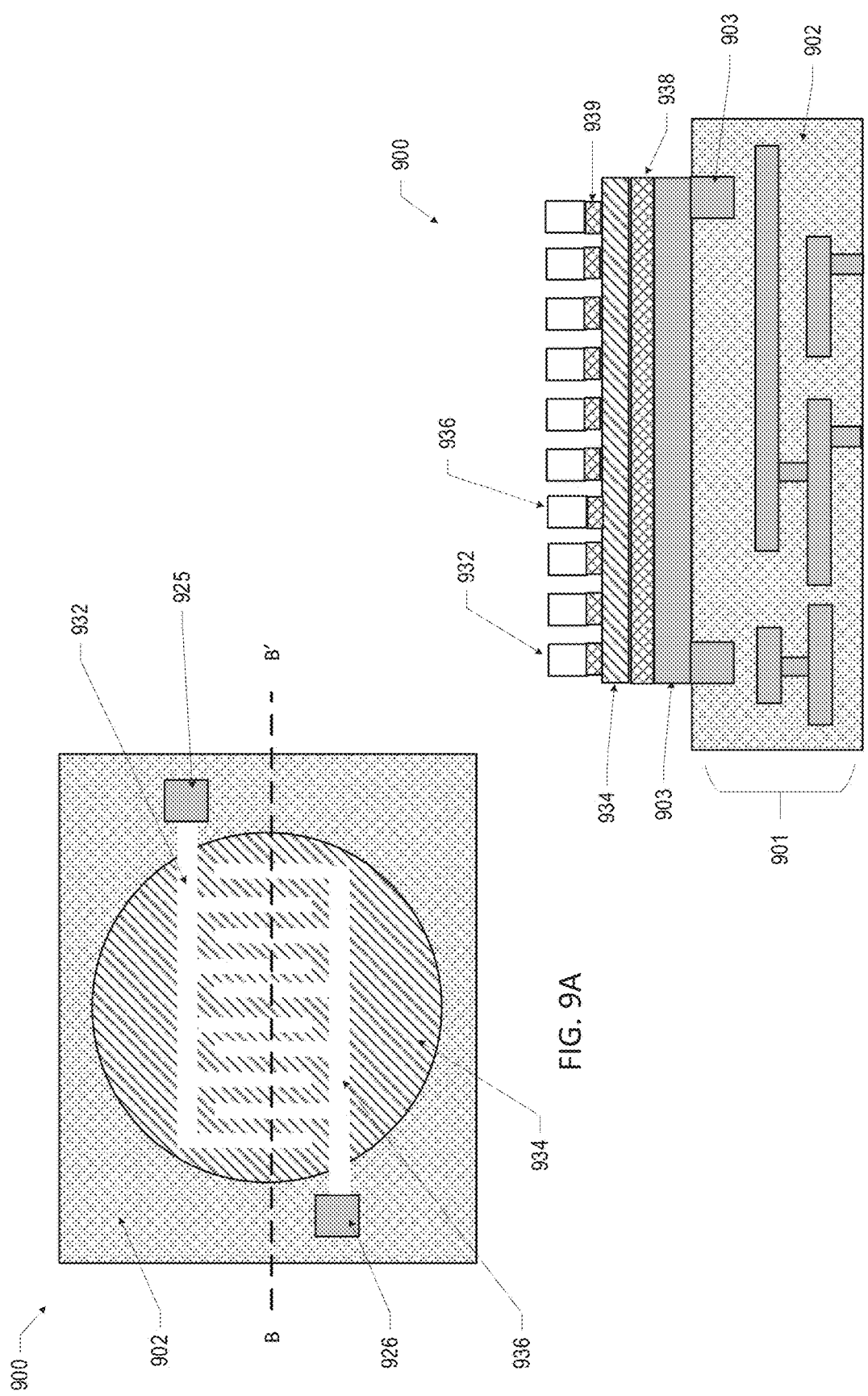

MICROELECTRONIC ASSEMBLIES HAVING SUBSTRATE-INTEGRATED PEROVSKITE LAYERS

BACKGROUND

Integrated circuit (IC) components, such as capacitors, resistors, actuators, accelerometers, transducers, and pressure sensors, having perovskite materials are typically manufactured separately on a high temperature substrate, and then surface mounted on an organic package substrate or motherboard.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 3A is a side, cross-sectional view of a microelectronic assembly, in accordance with various embodiments.

FIG. 3B is a magnified view of an area of FIG. 3A indicated by the dotted lines that shows the perovskite crystalline structure at the perovskite dielectric/perovskite conductive interface, in accordance with various embodiments.

FIG. 4A is a side, cross-sectional view of a microelectronic assembly, in accordance with various embodiments.

FIG. 4B is a magnified view of an area of FIG. 4A indicated by the dotted lines that shows the perovskite crystalline structure at the perovskite dielectric/perovskite conductive interface, in accordance with various embodiments.

FIGS. 9A and 9B illustrate a top view and a side, cross-sectional view along the B-B' line, respectively, of a microelectronic assembly, in accordance with various embodiments.

DETAILED DESCRIPTION

Figure 1:
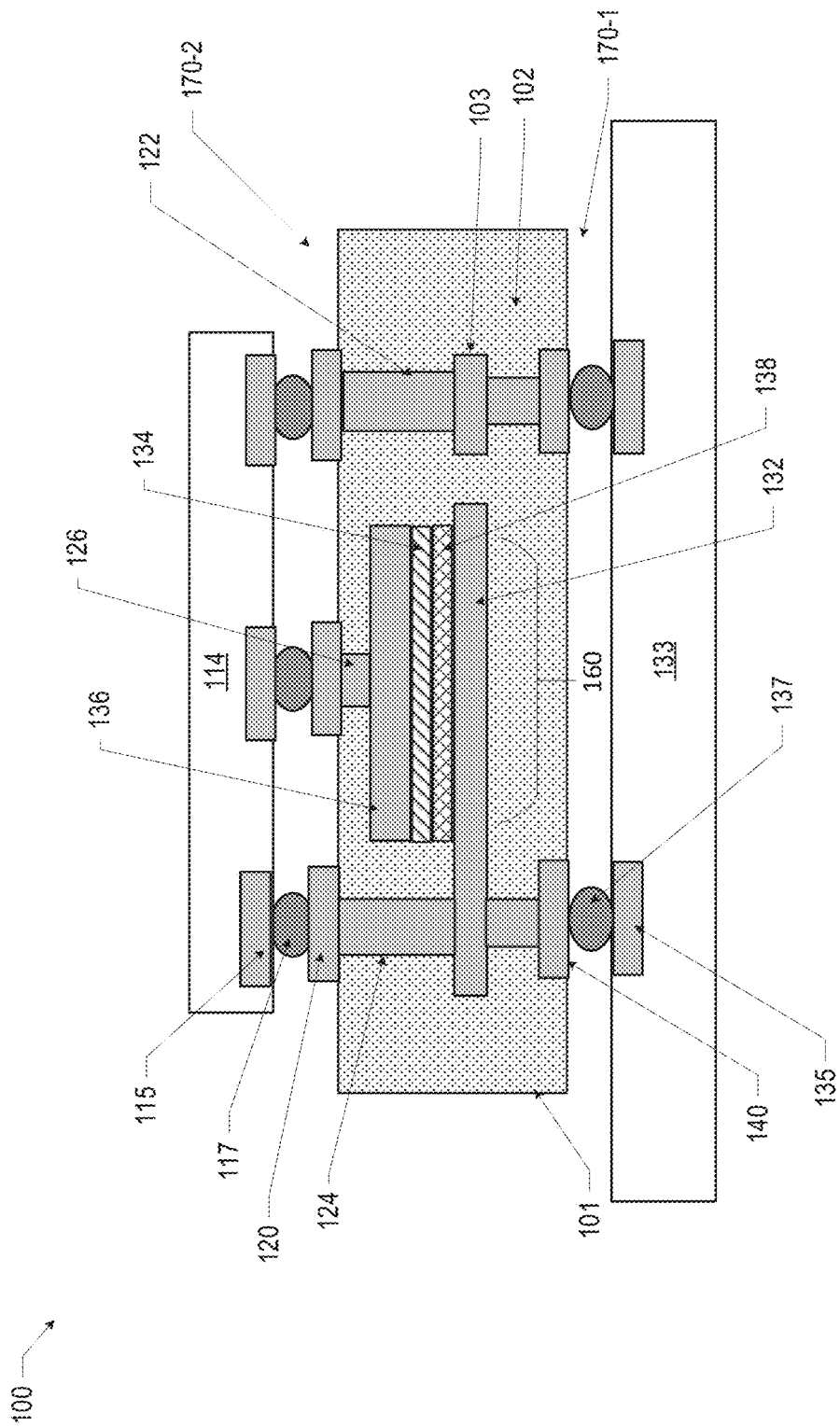
FIG. 1 is a side, cross-sectional view of a microelectronic assembly, in accordance with various embodiments.

Disclosed herein are microelectronic assemblies with integrated perovskite layers, and related devices and methods. For example, in some embodiments, a microelectronic assembly may include an organic package substrate portion having a surface with a conductive layer, a perovskite conductive layer on the conductive layer, and a perovskite dielectric layer on the perovskite conductive layer. In some embodiments, a crystalline structure of the perovskite dielectric layer may have a same orientation as a crystalline structure of the perovskite conductive layer.

In some embodiments, a microelectronic assembly may include an organic package substrate portion having a conductive layer on a surface, and an electronic component, where the electronic component includes one of a capacitor, an actuator, an accelerometer, an inductor, an energy harvester, a filter, a resonator, a transducer, a sensor, and a resistor, and where the electronic component includes a perovskite conductive layer on the conductive layer on the surface of the organic package substrate portion.

Electronic components, such as capacitors, resistors, accelerometers, resonators, transducers, and pressure sensors, are commonly included in microelectronic assemblies that are electrically coupled through a substrate to a die. Some electronic components incorporate perovskite-type materials or perovskite materials. Typically, a perovskite or perovskite-type material may include any material with a perovskite crystalline structure. The general chemical formula for a perovskite material is $ABX_3$, where 'A' and 'B' are two cations of very different sizes (e.g., a larger-sized metal cation, A', and a smaller-sized transition metal cation, B'), and X is an anion that bonds to both (e.g., oxygen). For example, many oxides that have the chemical formula $ABO_3$ may adopt the perovskite structure, where type 'A' atoms sit at cube corner positions (0, 0, 0), type 'B' atoms sit at body center position (1/2, 1/2, 1/2) and oxygen atoms sit at face center positions (1/2, 1/2, 0) of a face-centered cubic unit cell. A thin film of a perovskite material may adopt the perovskite crystalline structure with different orientations, or texture, i.e. with different planes such as (100) or (110) aligned with the film surface or interface.

The properties of a perovskite material may depend on the combination of cations in the crystal. Some perovskite materials have conductive properties and some perovskite materials have dielectric properties. Examples of perovskite dielectric materials may include barium titanate ($BaTiO_3$), lead zirconate titanate (PZT), sodium potassium niobate (KNN), and barium strontium titanate (BST). Some perovskite dielectric materials have ferroelectric properties, which are desirable in many electronic components, such as power delivery capacitors, actuators, and sensors, because of their ultra-high permittivity and piezoelectric performance. Examples of perovskite conductive materials may include lanthanum nickel oxide (LNO), lanthanum strontium manganese oxide (LSMO), lanthanum barium tin oxide (LBSO), strontium ruthenium oxide (SRO), and lanthanum strontium cobalt oxide (LSCO).

Typically, perovskite materials may require annealing, sintering, or deposition at temperatures of greater than 500 degrees Celsius to form the desired perovskite crystalline structures. Organic electronic packages are sensitive to high temperatures, so electronic components having perovskite materials may be fabricated separately on high temperature substrates then mounted on organic electronic packages. These separately manufactured components add high inductance, increase Z-height (i.e., thickness), and add assembly steps, which may be particularly challenging with miniaturization of components to sub-millimeter length scales. Disclosed herein are advantageous perovskite-based structures and new processes to deposit and crystallize perovskite layers during the manufacture of an organic substrate without degrading the organic substrate.

Various ones of the embodiments disclosed herein may provide improved organic substrates due to the material properties of perovskite materials (e.g., ultra-high permittivity and exceptional piezoelectric performance). For example, various ones of the embodiments disclosed herein may improve IC die performance, may exhibit better power delivery and signal speed, may add functionality to the package, may decrease overall size of the package or system, and may reduce costs, relative to conventional approaches by enabling fabrication of perovskite materials on larger scale organic panel manufacturing rather than separate fabrication on high temperature substrates. The microelectronic assemblies disclosed herein may be particularly advantageous for data center servers and for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die."

The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and V" represents a range that includes X and Y. For convenience, the phrase "FIG. 2" may be used to refer to the collection of drawings of FIGS. 2A-2B, and the phrase "FIG. 5" may be used to refer to the collection of drawings of FIGS. 5A-5K, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. The microelectronic assembly 100 may include a package substrate 101 having a perovskite conductive layer 138 and a perovskite dielectric layer 134. The package substrate 101 may include a top surface 170-2 and a bottom surface 170-1. The package substrate 101 may include an insulating material (e.g., a dielectric material formed in multiple layers) and one or more conductive pathways through the dielectric material (e.g., including conductive traces and/or conductive vias 124, 126, and a conductive through-via 122, as shown, or any other suitable structure for routing electrical signals). As shown in FIG. 1, the package substrate 101 may include conductive layers 103 that alternate with dielectric layers 102. The package substrate 101 may include an organic substrate, where one or more dielectric layers may include an organic material. In some embodiments, the dielectric layers 102 may be formed using any suitable organic dielectric material, or low-k and ultra low-k dielectric material, such as a fire retardant grade 4 material (FR-4), bismaleimide triazine (BT) resin, polyimide materials, or glass reinforced epoxy matrix materials.

The conductive layers 103 may be formed using any suitable conductive material, such as copper, and may be formed using any suitable process, such as electroplating. An individual conductive layer 103 and an individual dielectric layer 102 may include a single layer or may include multiple layers, for example, conductive layer 103 may include a seed layer and a patterned trace layer. In some embodiments, conductive layer 103 may be a patterned trace layer. In some embodiments, conductive layer 103 may be a continuous layer. The conductive pathways in the package substrate 101 may be bordered by liner materials, such as adhesion liners and/or barrier liners, as suitable. The conductive pathways disclosed herein (e.g., conductive traces and/or conductive vias) may be formed of any suitable conductive material, such as copper, silver, nickel, gold, aluminum, or other metals or alloys, for example. Although FIG. 1 illustrates a specific number and arrangement of conductive pathways in the package of 101, these are simply illustrative, and any suitable number and arrangement may be used.

In some embodiments, the package substrate 101 may include an electronic component 160 with a perovskite conductive layer 138 and a perovskite dielectric layer 134. For example, as shown in FIG. 1, the electronic component 160 may be a capacitor having a first electrode 132, a perovskite conductive layer 138 that may function as part of the first electrode 132 (e.g., to transport charge), a perovskite dielectric layer 134, and a second electrode 136. In some embodiments, the perovskite conductive layer 138 has a first crystalline structure and the perovskite dielectric layer 134 has a second crystalline structure, where the first crystalline structure has a same orientation as the second crystalline structure. In some embodiments, the first crystalline structure has a different orientation than the second crystalline structure. The first and second electrodes 132, 136 may be formed of any suitable conductive material, such as copper, and may be formed using any suitable process, such as electroplating or sputtering. The first and second electrodes 132, 136 may include one or more conductive layers, and may be formed using any suitable conductive material or materials, such as copper, tin, nickel, palladium, or platinum, among others. The perovskite conductive layer 138 may be formed on the first electrode 132 using any suitable material having a perovskite conductive crystalline structure, such as LNO, LSMO, LBSO, SRO, or LSCO, among others, and by any suitable process, including, for example, the process described below with reference to FIGS. 5A-5K. The perovskite dielectric layer 134 may be formed from any suitable dielectric material having a perovskite crystalline structure, such as $BaTiO_3$, PZT, KNN, or BST, and may be formed using any suitable process, including the process described below with reference to FIGS. 5A-5K, where the perovskite dielectric layer 134 is deposited on the perovskite conductive layer 138. In some embodiments, the dielectric layer may be a non-perovskite dielectric layer (not shown) and may be formed using a non-perovskite dielectric material. In some embodiments, a perovskite conductive layer (not shown) may be formed on the perovskite dielectric layer 134 (e.g., between the perovskite dielectric layer 134 and the second electrode 136) and may function as part of the second electrode 136. The first electrode 132 may be coupled to conductive pathway, or via, 124. The second electrode 136 may be coupled to conductive pathway, or via, 126.

In some embodiments, a package substrate 101 may be manufactured using a modified semi-additive process or a semi-additive build-up process with advanced lithography (with small vertical interconnect features formed by advanced laser or lithography processes). In some embodiments, a package substrate 101 may be manufactured using a standard printed circuit board (PCB) process (e.g., a standard subtractive process using etch chemistry to remove areas of unwanted copper, and with coarse vertical interconnect features formed by a standard laser process). The elements of the microelectronic assembly 100 may have any suitable dimensions. For example, in some embodiments, a thickness of the package substrate 101 may be between 0.25 millimeters and 3 millimeters.

The microelectronic assembly 100 may also include a circuit board 133. The package substrate 101 may be coupled to the circuit board 133 by second-level interconnects 137 at the bottom surface 170-1 of the package substrate 101. In particular, the package substrate 101 may include conductive contacts 140 at its bottom surface, and the circuit board 133 may include conductive contacts 135 at its top surface; the second-level interconnects 137 may electrically and mechanically couple the conductive contacts 135 and the conductive contacts 140. The second-level interconnects 137 illustrated in FIG. 1 are solder balls (e.g., for a ball grid array arrangement), but any suitable second-level interconnects 137 may be used (e.g., pins in a pin grid array arrangement or lands in a land grid array arrangement).

The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 137 may not couple the package substrate 101 to a circuit board 133, but may instead couple the package substrate 101 to another IC package, an interposer, or any other suitable component.

The microelectronic assembly 100 may also include a die 114. The package substrate 101 may be coupled to the die 114 by first-level interconnects 117 at the top surface 170-2 of the package substrate 101. In particular, the package substrate may include conductive contacts 120 the top surface 170-2 of the package substrate, and the die 114 may include conductive contacts 115 at its bottom surface; the first-level interconnects 117 may electrically and mechanically couple the conductive contacts 115 and the conductive contacts 120. The first-level interconnects 117 illustrated in FIG. 1 are solder bumps, but any suitable first-level interconnects 117 may be used.

Although FIG. 1 depicts a package-integrated electronic component 160 having a perovskite conductive layer and a perovskite dielectric layer, in some embodiments, a perovskite conductive layer and a perovskite dielectric layer may be integrated in an organic package substrate separate from an electronic component. Further, although FIG. 1 depicts a single package-integrated electronic component 160 having a perovskite conductive layer and a perovskite dielectric layer, the microelectronic assembly 100 disclosed herein may have any suitable number of such electronic components, in addition to other components. More generally, the microelectronic assemblies disclosed herein may have any suitable number and arrangement of such electronic components, including one or more electronic components that are embedded in an organic package substrate and/or one or more components integrated on a surface of an organic package substrate. Examples of an electronic component may include a capacitor, an actuator, an accelerometer, an inductor, an energy harvester, a filter, a resonator, a transducer, a sensor, and a resistor.

FIG. 1 illustrates a number of elements that are omitted from subsequent drawings for ease of illustration, but may be included in any of the microelectronic assemblies disclosed herein. Examples of such elements include the die 114, the second-level interconnects 137, and/or the circuit board 133. Many of the elements of the microelectronic assembly 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in the microelectronic subassemblies disclosed herein, for example, additional active components, such as additional dies, or additional passive components, such as surface-mount resistors, capacitors, and/or inductors, may be disposed on the top surface or the bottom surface of the package substrate 101, or embedded in the package substrate 101.

Figure 2A:
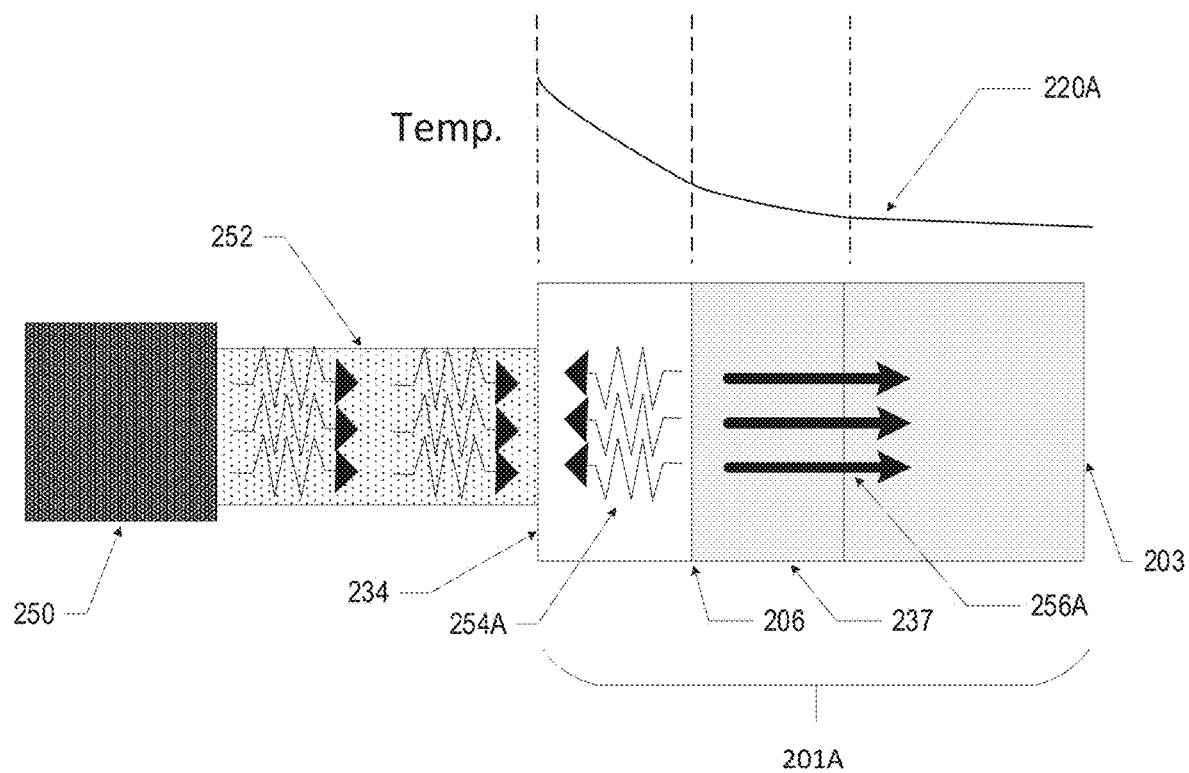
FIG. 2A is a graphical illustration of energy transport in a package substrate portion at the perovskite dielectric/metal interface during laser anneal.
Figure 2B:
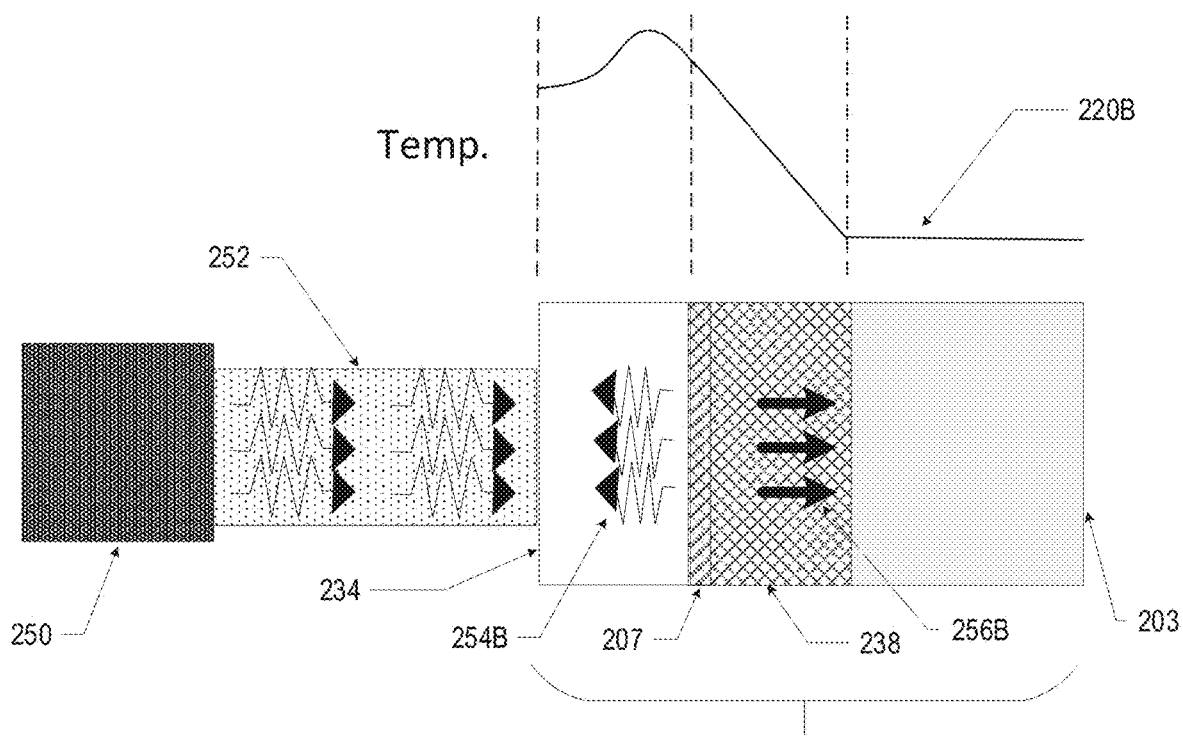
FIG. 2B is a graphical illustration of energy transport in a package substrate portion at the perovskite dielectric/perovskite conductive interface during laser anneal, in accordance with various embodiments.

FIG. 2A is a graphical illustration of energy transport in a package substrate portion at the perovskite dielectric/metal interface during laser anneal, in accordance with various embodiments. A package substrate portion 201A may include a metal conductive layer 203, a metal electrode 237, and a perovskite dielectric layer 234. The metal conductive layer 203 may be made from any suitable metal material, such as copper. The metal electrode 237 may be made from any suitable metal material, such as platinum, which is an inert material and has good lattice matching to perovskite dielectric materials. The dielectric layer 234 may include a perovskite dielectric material that may be crystallized by heating to temperatures at least greater than 500 degrees Celsius by absorbing the photon energy in the laser beam 252 of a laser 250 using. As illustrated schematically in FIG. 2A, during laser crystallization, the temperature 220A of the package substrate portion 201A may decrease with increased distance from the surface of dielectric layer 234. The energy transport as illustrated by arrows 254A and 256A at the perovskite dielectric/metal electrode interface 206 show photon energy being reflected and/or absorbed and thermally diffused away from the interface 206, and the required crystallization temperature may not be reached near the interface FIG. 2B is a graphical illustration of energy transport in a package substrate portion at the perovskite dielectric/perovskite conductive interface during laser anneal, in accordance with various embodiments. A package substrate portion 201B may include a metal conductive layer 203, a perovskite conductive layer 238, and a perovskite dielectric layer 234. The metal conductive layer 203 may be made from any suitable metal material, such as copper. The perovskite conductive layer may be made from any suitable conductive material having a perovskite crystalline structure. The perovskite conductive layer 238 may function as a seed layer and an electrode to transport charge to the perovskite dielectric interface, and the metal conductive layer 203 may function as a heat sink and as part of the electrode to increase the lateral conductivity of the electrode stack. As shown in FIG. 2B, during laser crystallization, the temperature 220B of the package substrate portion 201B increases at the perovskite dielectric/perovskite conductive interface 207. The energy transport as illustrated by arrows 254b and 256b at the perovskite dielectric/perovskite conductive interface 207 show a reduced amount of photon energy being reflected away from the interface 207 and a reduced rate of thermal energy, as compared to FIG. 2A, being diffused away from the interface 206, such that the temperature 220B is increased at the interface 207. In some embodiments, the perovskite dielectric layer and the perovskite conductive layer may have a same crystalline structure orientation, such that, the perovskite conductive layer may reduce the energy required to crystallize the perovskite dielectric layer and may improve the perovskite dielectric crystal quality by reducing the lattice distortion near the interface.

FIG. 3A is a side, cross-sectional view of a microelectronic assembly 300A, in accordance with various embodiments. The microelectronic assembly 300A may include a package substrate 301 having an electronic component 360 with a perovskite conductive layer 338 and a perovskite dielectric layer 334, with a perovskite dielectric/perovskite conductive interface 307. For example, as shown in FIG. 3A, the electronic component 360 may be an embedded capacitor having a first electrode 332, a perovskite conductive layer 338 that may function as part of the first electrode 332 (e.g., to transport charge), a perovskite dielectric layer 334, and a second electrode 336. The first electrode may be coupled to through-via 322, and the second electrode may be coupled to via 326.

FIG. 3B is a magnified view of an area of FIG. 3A indicated by the dotted lines that shows the perovskite crystalline structure at the perovskite dielectric/perovskite conductive interface, in accordance with various embodiments. As shown in FIG. 3B, a perovskite conductive material may include a larger-sized metal cation 350, a smaller-sized metal cation 352, and an anion 354, and a perovskite dielectric material may include a larger-sized metal cation 340, a smaller-sized metal cation 342, and an anion 344. A perovskite crystalline structure may have any suitable orientation, such as (100) or (110), and a perovskite material may have more than one orientation. For example, as shown in FIG. 3B, the perovskite conductive layer 338 has a polycrystalline structure with two crystalline orientations shown on each side of a grain boundary; a first portion 382 having a (110) orientation and a second portion 386 having a (100) orientation. In some embodiments, the perovskite dielectric layer 334, when grown on the perovskite conductive layer 338, will have the same crystal orientation as the perovskite conductive layer 338. For example, a perovskite dielectric layer 334 may be crystallized on the perovskite conductive layer 338 and nucleated from the perovskite conductive layer 338, which may orient the crystal structure of the perovskite dielectric layer 334 to have the same orientation as the perovskite conductive layer 338. In some embodiments, the crystalline structure of the perovskite dielectric layer may have a different orientation than the crystalline structure of the perovskite conductive layer. As shown in FIG. 3B, the perovskite dielectric layer has two crystalline structure orientations that are the same as the perovskite conductive layer 338; a first portion 380 having a (110) orientation and a second portion 384 having a (100) orientation. FIG. 3B shows an example of two adjacent crystal grains, but the layers may have any number of grains with any number of different orientations. In some embodiments, the conductive and perovskite dielectric layers may have crystalline orientations other than (100) and (110), and may have more than two crystal orientations. For example, in some embodiments, the crystalline orientation may include (100), (110), (111), (211), and/or (210). In some embodiments, the crystalline orientation may be random. Although FIG. 3B shows an ordered lattice at the perovskite dielectric/perovskite conductive interface 307, the lattice may be distorted at this interface and may become more structured or less structures as the perovskite dielectric crystal structure grows away from the interface. Further, although FIG. 3B shows a particular orientation at a particular portion, the perovskite dielectric and conductive layers may have any orientations and in any order. Although FIG. 3B shows the crystalline structures of the perovskite conductive and perovskite dielectric layers as having the same orientation, the crystalline structures of the perovskite conductive and perovskite dielectric layers may have different orientations.

The perovskite crystalline structure, orientation, and composition may be detected by a combination of Scanning Electron Microscope (SEM), Transmission Electron Microscope (TEM), X-ray Diffraction (XRD), X-ray Photoelectron Spectroscopy (XPS), Rutherford Backscattering Spectrometry (RBS), and Raman Spectroscopy, among others.

FIG. 4A is a side, cross-sectional view of a microelectronic assembly 400A, in accordance with various embodiments. The microelectronic assembly 400A may include a package substrate 401 having an electronic component 460 with a perovskite conductive layer 438 and a perovskite dielectric layer 434, with a perovskite dielectric/perovskite conductive interface 407. For example, as shown in FIG. 4A, the electronic component 460 may be an embedded capacitor having a first electrode 432, a perovskite conductive layer 438 that may function as part of the first electrode 432, a perovskite dielectric layer 434, and a second electrode 436. The first electrode may be coupled to through-via 422, and the second electrode may be coupled to via 426.

FIG. 4B is a magnified view of an area of FIG. 4A indicated by the dotted lines that shows the perovskite crystalline structure at the perovskite dielectric/perovskite conductive interface, in accordance with various embodiments. As shown in FIG. 4B, a perovskite conductive material may include a larger-sized metal cation 450, a smaller-sized metal cation 452, and an anion 454, and a perovskite dielectric material may include a larger-sized metal cation 440, a smaller-sized metal cation 442, and an anion 444. A perovskite crystalline structure may have any suitable orientation, such as (100) or (110), and may have any number of orientations. In some embodiments, the perovskite conductive and perovskite dielectric layers may have a single crystal orientation. For example, as shown in FIG. 4B, the perovskite conductive layer 438 has a (100) orientation and the perovskite dielectric layer 434 has the same (100) orientation. Although FIG. 4B shows a (100) orientation, the orientation may be any suitable orientation, including (110), (111), (211), (210), or any other orientation. In some embodiments, the crystalline orientation may be random. Although FIG. 4B. shows only a single crystal, the perovskite layers may be polycrystalline with many grains with a single orientation (e.g., (100)), or any other single orientation. Although FIG. 4B shows an ordered lattice at the perovskite dielectric/perovskite conductive interface 407, the lattice may be distorted at this interface and may become more structured or less structured as the perovskite dielectric crystal structure grows away from the interface. Although FIG. 4B shows the crystalline structures of the perovskite conductive and perovskite dielectric layers as having the same orientation, the crystalline structures of the perovskite conductive and perovskite dielectric layers may have different orientations.

Any suitable techniques may be used to manufacture the microelectronic assemblies disclosed herein. For example, FIGS. 5A-5K are side, cross-sectional views of various stages in an example process for manufacturing a microelectronic assembly, in accordance with various embodiments. Although the operations discussed below with FIGS. 5A-5K are illustrated in a particular order, these operations may be performed in any suitable order. Additionally, although particular assemblies are illustrated in FIGS. 5A-5K, the operations discussed below with reference to FIGS. 5A-5K may be used to form any suitable assemblies.

Figure 5A:
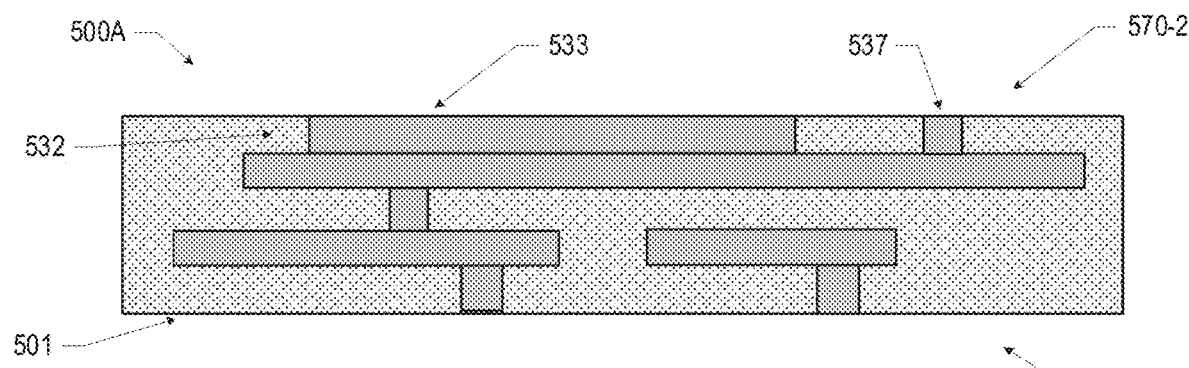
FIGS. 5A-5K are side, cross-sectional views of various stages in an example process for manufacturing an example microelectronic assembly, in accordance with various embodiments.

FIG. 5A illustrates an assembly 500A including a package substrate portion 501 having a top surface 570-2 and a bottom surface 570-1. In some embodiments, the package substrate portion 501 may be formed using a lithographically-defined via packaging process. In some embodiments, the package substrate portion 501 is an organic substrate. In some embodiments, the organic package substrate portion 501 may include a plurality of dielectric layers formed from an organic dielectric. In some embodiments, only the dielectric layer adjacent to the top surface of the organic package substrate may be formed from an organic dielectric material. In some embodiments, the package substrate portion 501 may include a core. In some embodiments, the package substrate portion 501 may be coreless. In some embodiments, the package substrate portion 501 may be manufactured using standard PCB manufacturing processes, and thus the package substrate portion 501 may take the form of a PCB. In some embodiments, the package substrate portion 501 may be a set of redistribution layers formed on a panel carrier (not shown) by laminating or spinning on a dielectric material and creating conductive vias and lines by laser drilling and plating. In some embodiments, the package substrate portion 501 may be formed on a removable carrier (not shown) using any suitable technique, such as a redistribution layer technique. Any method known in the art for fabrication of the package substrate portion 501 may be used, and for the sake of brevity, such methods will not be discussed in further detail herein. The package substrate portion 501 may include conductive contacts (not shown) at the bottom surface for attaching to a circuit board.

The package substrate portion 501 may be built up to a desired layer for integrating a perovskite conductive layer. The package substrate portion may have a first conductive layer 532 on the top surface 570-1. In some embodiments, a metallization or conductive layer may be patterned on the top surface 570-1 of the package substrate portion 501 to form conductive structures, such as via 537 and electrode 533. The conductive layer 532 may be formed by depositing, exposing, and developing a photoresist layer on the top surface 570-1 of the package substrate portion 501. The photoresist layer may be patterned to form conductive features in the conductive layer 532. Conductive material, such as copper, may be deposited in the openings in the patterned photoresist layer to form conductive features, such as traces and via pads and other passive structures such as package electrodes, capacitors, or inductors. The conductive material may be depositing using any suitable process, such as electroplating, sputtering, or electroless plating. The photoresist may be removed to expose the conductive features of conductive layer 532.

Figure 5B:
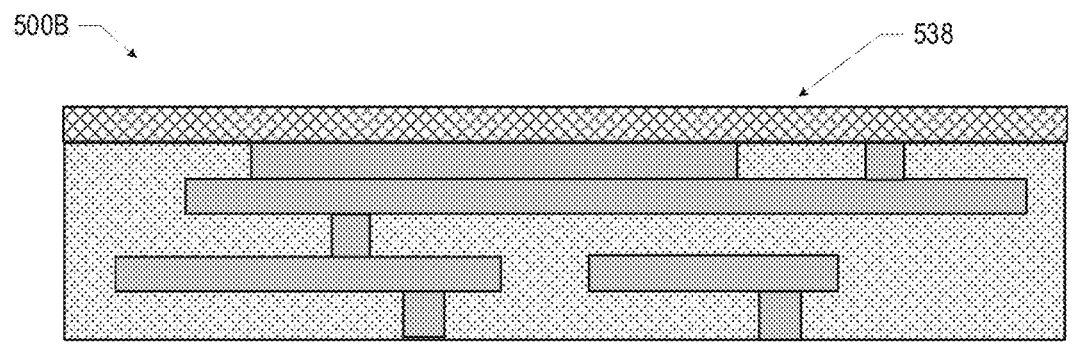

FIG. 5B illustrates an assembly 500B subsequent to forming a first perovskite conductive layer 538 on the first conductive layer 532. The first perovskite conductive layer 538 may be formed using any suitable process, such as sputtering. In some embodiments, the first perovskite conductive layer 538 may be deposited on the first conductive layer 532 at temperatures between 25 degrees Celsius to 230 degrees Celsius to form a partially crystalline or amorphous layer. The first perovskite conductive layer 538 may have any suitable thickness, for example, a thickness between 50 nanometers (nm) and 2 micrometers (um).

Figure 5C:
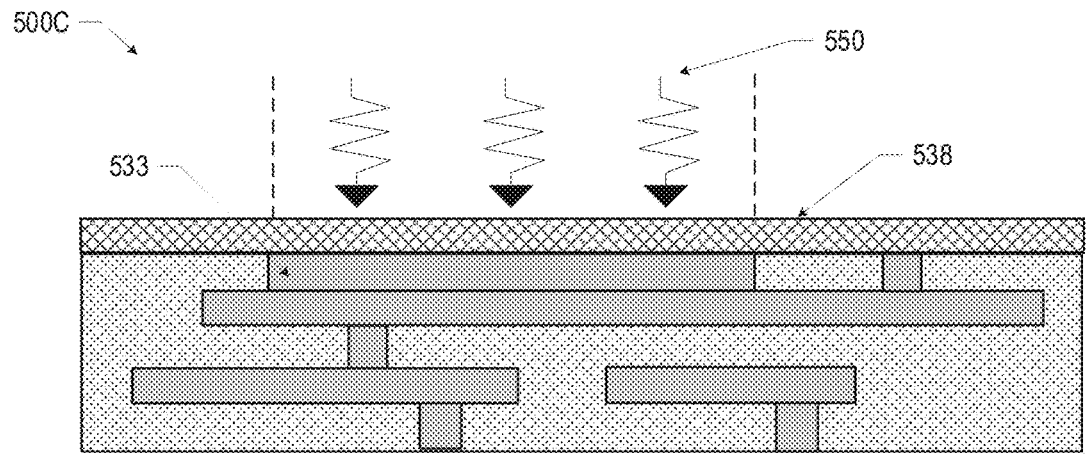

FIG. 5C illustrates an assembly 500C subsequent to annealing the first perovskite conductive layer 538 to form a perovskite crystalline structure. The first perovskite conductive layer 538 may be annealed using any suitable process, such as pulsed laser annealing 550. A pulsed laser annealing process may be applied to a select area, such as the area above the electrode 533, as illustrated by the dotted lines. The pulsed laser annealing process parameters may vary. For example, the pulsed laser annealing process parameters may depend on the laser frequency or pulse frequency, the scanning speed, the laser fluence, the rate of heat transfer away from the crystallization interface, the total overall annealing time, and/or the substrate temperature, among others.

Figure 5D:
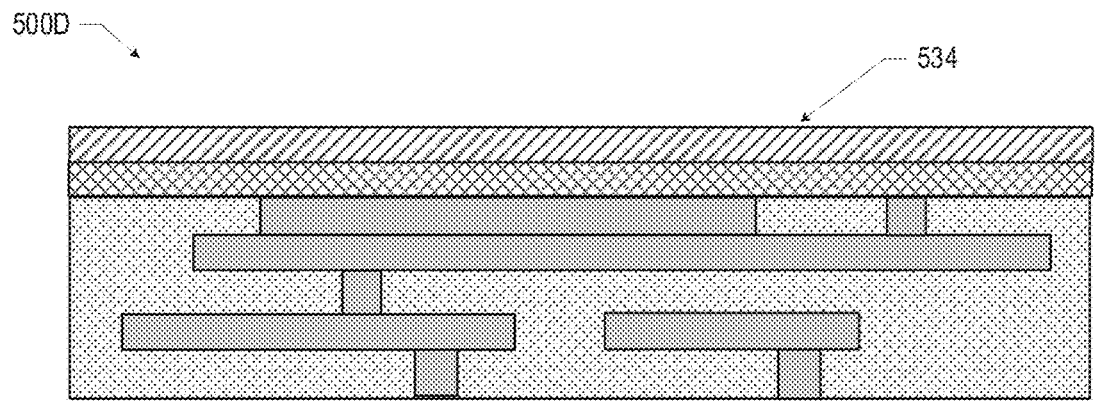

FIG. 5D illustrates an assembly 500D subsequent to forming a perovskite dielectric layer 534 on the first perovskite conductive layer 538. The perovskite dielectric layer 534 may be formed using any suitable process, such as sputtering. In some embodiments, the perovskite dielectric layer 534 may be deposited on the first perovskite conductive layer 538 at temperatures between 25 degrees Celsius to 230 degrees Celsius to form a partially crystalline or amorphous layer. The perovskite dielectric layer 534 may have any suitable thickness, for example, a thickness between 50 nm and 5 um.

Figure 5E:
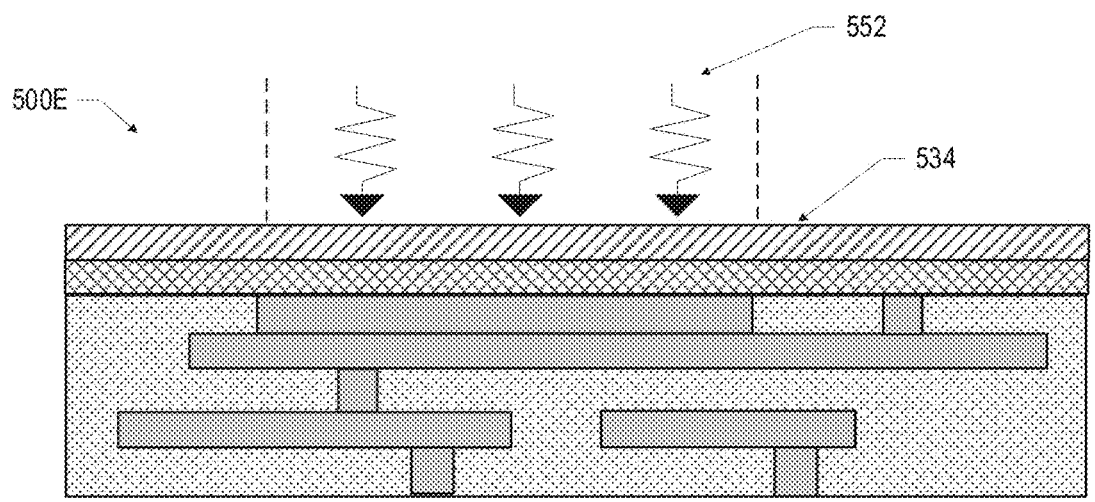

FIG. 5E illustrates an assembly 500E subsequent to annealing the perovskite dielectric layer 534 to form a perovskite crystalline structure. The perovskite dielectric layer 534 may be annealed using any suitable process, such as pulsed laser annealing 552. A pulsed laser annealing process may be applied to a select area, such as the area above the electrode 533, as illustrated by the dotted lines. The pulsed laser annealing process parameters may vary, as described above with reference to FIG. 5C. In some embodiments, during crystallization, the perovskite dielectric crystalline structure may align to have the same orientation as the first perovskite conductive crystalline structure and may require less crystallization energy (e.g., less annealing). In some embodiments, the perovskite dielectric crystalline structure may have a different orientation than the first perovskite conductive crystalline structure.

Figure 5F:
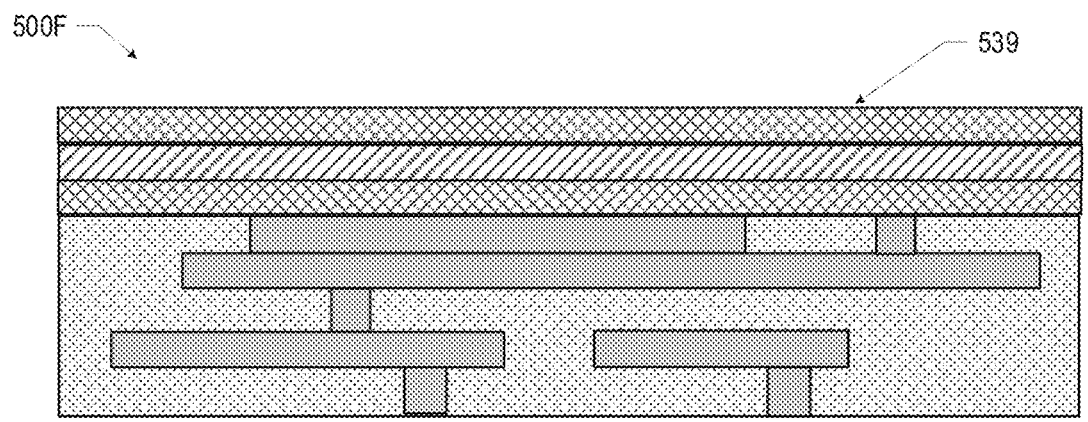

FIG. 5F illustrates an assembly 500F subsequent to forming a second perovskite conductive layer 539 on the perovskite dielectric layer 534. The second perovskite conductive layer 539 may be formed using any suitable process, such as sputtering. In some embodiments, the second perovskite conductive layer 539 may be deposited on the perovskite dielectric layer 534 at temperatures between 25 degrees Celsius to 230 degrees Celsius to form a partially crystalline or amorphous layer. The second perovskite conductive layer 539 may have any suitable thickness, for example, a thickness between 50 nm and 2 um.

Figure 5G:
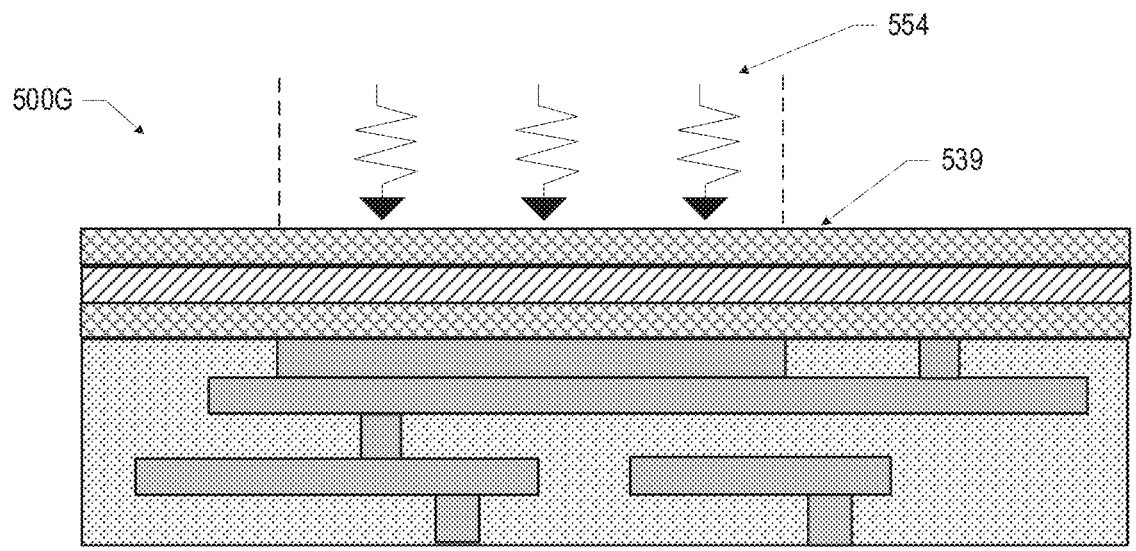

FIG. 5G illustrates an assembly 500G subsequent to annealing the second perovskite conductive layer 539 to form a perovskite crystalline structure. The second perovskite conductive layer 539 may be annealed using any suitable process, such as pulsed laser annealing 554. A pulsed laser annealing process may be applied to a select area, such as the area above the electrode 533, as illustrated by the dotted lines. The pulsed laser annealing process parameters may vary, as described above with reference to FIG. 5C. In some embodiments, during crystallization, the second perovskite conductive crystalline structure may align to have the same orientation as the perovskite dielectric crystalline structure and may require less crystallization energy (e.g., less annealing). In some embodiments, the second perovskite conductive crystalline structure may have a different orientation than the perovskite dielectric crystalline structure. In some embodiments, a second perovskite conductive layer may be omitted (e.g., omit 5F and 5G, and proceed from 5E to 5H to form a second conductive layer 536 on the perovskite dielectric layer 534).

Figure 5H:
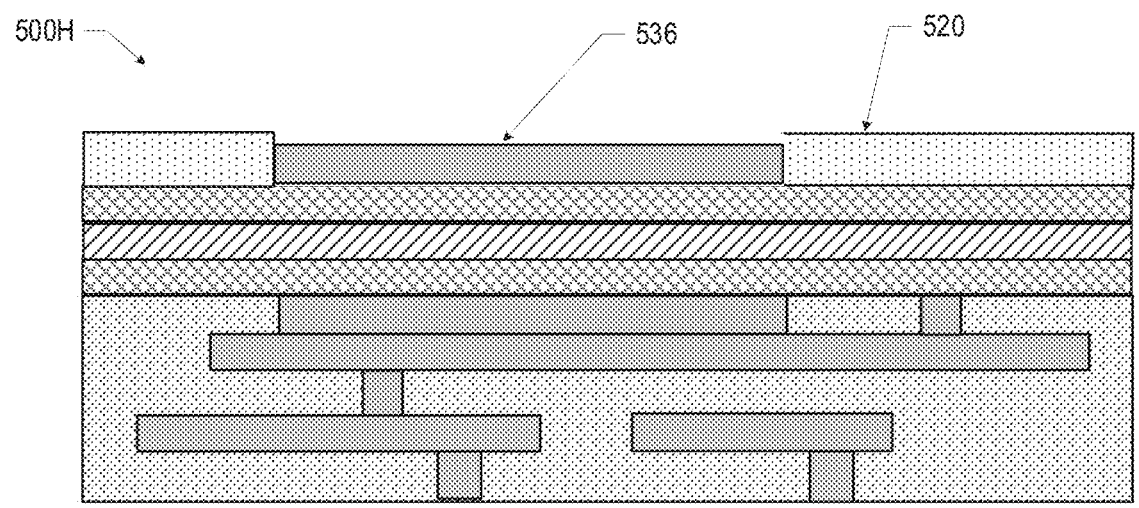

FIG. 5H illustrates an assembly 500H subsequent to forming a second conductive layer 536 on the second perovskite conductive layer 539. In some embodiments, the second conductive layer 536 may be formed by depositing a photoresist material 520 on the second perovskite conductive layer 539, patterning the photoresist material to provide an opening, and depositing a conductive material in the opening. The photoresist material 520 may be patterned using any suitable technique, including a lithographic process (e.g., exposing the photoresist material to a radiation source through a mask and developing with a developer). The openings may have any suitable size and shape for forming a conductive layer with structures having desired characteristics. For example, the opening may be shaped to form a conductive electrode. The conductive material may be deposited using any suitable technique, including, for example, electroplating, sputtering, or electroless plating. In some embodiments, a seed layer (not shown) may be deposited on the second perovskite conductive layer 539 prior to depositing a photoresist material. The seed layer may be any suitable conductive material, including copper, and may be deposited using any suitable process, such as electroless plating.

Figure 5I:
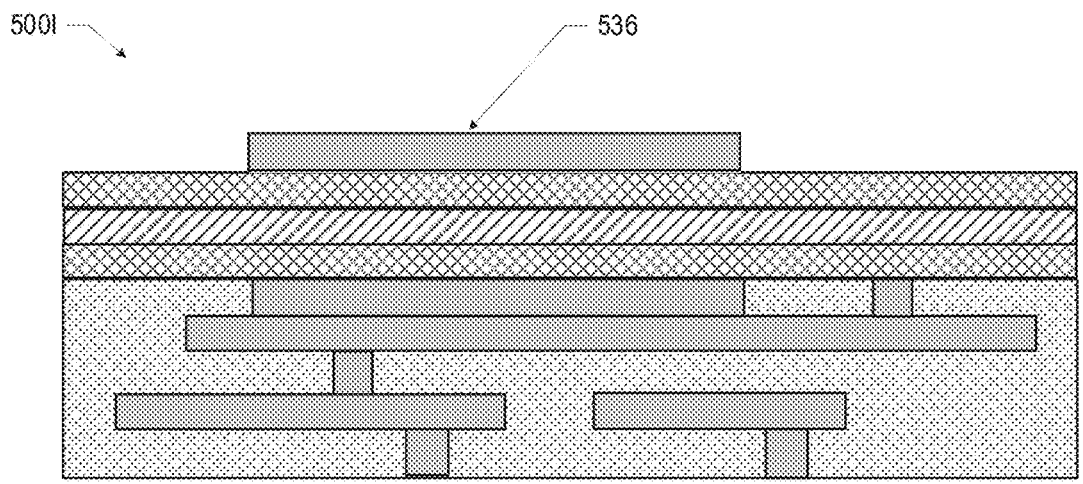

FIG. 5I illustrates an assembly 500I subsequent to stripping the photoresist material 520 and removing the seed layer, if deposited. The seed layer may be removed using any suitable process, such as chemical etching.

Figure 5J:
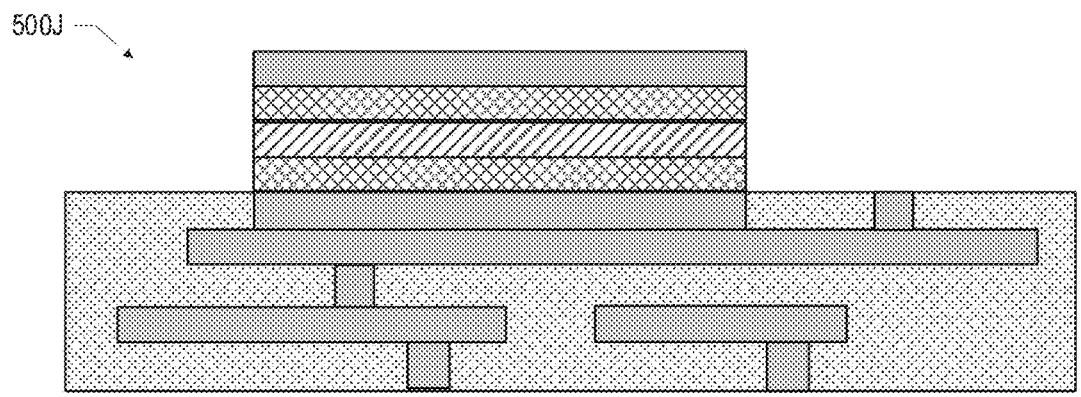

FIG. 5J illustrates an assembly 500J subsequent to removing portions of the first and second perovskite conductive layers 538, 539 and the perovskite dielectric layer 534 that are not covered by the second conductive layer 536. The conductive and perovskite dielectric layers 538, 539, 534 may be removed using any suitable technique, including etching, such as a wet etch, a dry etch (e.g., a plasma etch), or a wet blast. The second conductive layer 536 may be covered by a hard mask material to protect the second conductive layer 536 from removal. In some embodiments, the first and second perovskite conductive layers 538, 539 and the perovskite dielectric layer 534 may be formed using lithography, such that removing the conductive and perovskite dielectric layers 538, 539, 534 may be omitted.

Figure 5K:
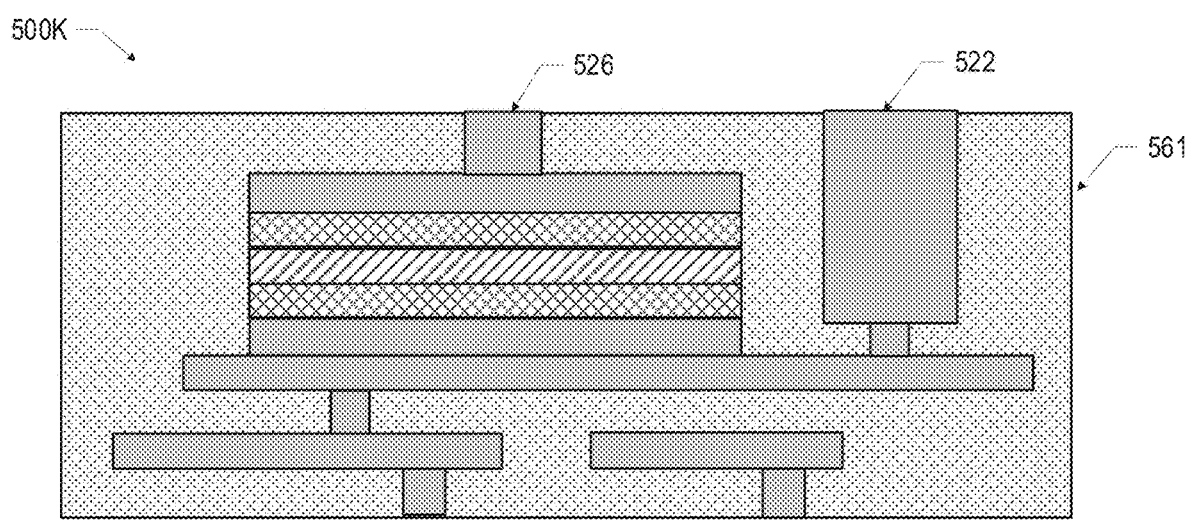

FIG. 5K illustrates an assembly 500K subsequent to forming a dielectric layer 561 and conductive structures 522, 526 over a top surface of assembly 500J. The conductive structures 522, 526 may be formed using any suitable process, including lithography, as described above with reference to FIGS. 5H-5I. The dielectric layer 561 may be formed using any suitable process, including lamination, or slit coating and curing. The dielectric layer 561 may be formed to completely cover the conductive structures 522, 526, such that the thickness of the deposited dielectric layer 561 is greater than the thickness of the conductive structures 522, 526. The dielectric layer 561 may be removed to expose the top surface of the conductive structures 522, 526 using any suitable technique, including grinding, or etching, such as a wet etch, a dry etch (e.g., a plasma etch), a wet blast, or a laser ablation (e.g., using excimer laser). In some embodiments, the thickness of the dielectric layer 561 may be minimized to reduce the etching time required to expose the top surface of the conductive structures 522, 526. In some embodiments, the conductive structures 522, 526 may be formed by forming a dielectric layer, laser drilling openings in the dielectric layer 561, and depositing conductive material in the openings to form the conductive structures 522, 526.

Additional layers may be built up and additional perovskite conductive and dielectric layers may be integrated in the package substrate 501 in other layers by repeating the process as described with respect to FIGS. 5A-5K. Although FIGS. 5A-5K shown a single-sided package substrate, the process may be performed on a double-sided substrate. The finished substrate may be a single package substrate or may be a repeating unit that may undergo a singulation process in which each unit is separated for one another to create a single package substrate. Further operations may be performed as suitable (e.g., attaching additional dies to the package substrate 501, attaching solder balls for coupling to a circuit board, etc.).

Figure 6A:
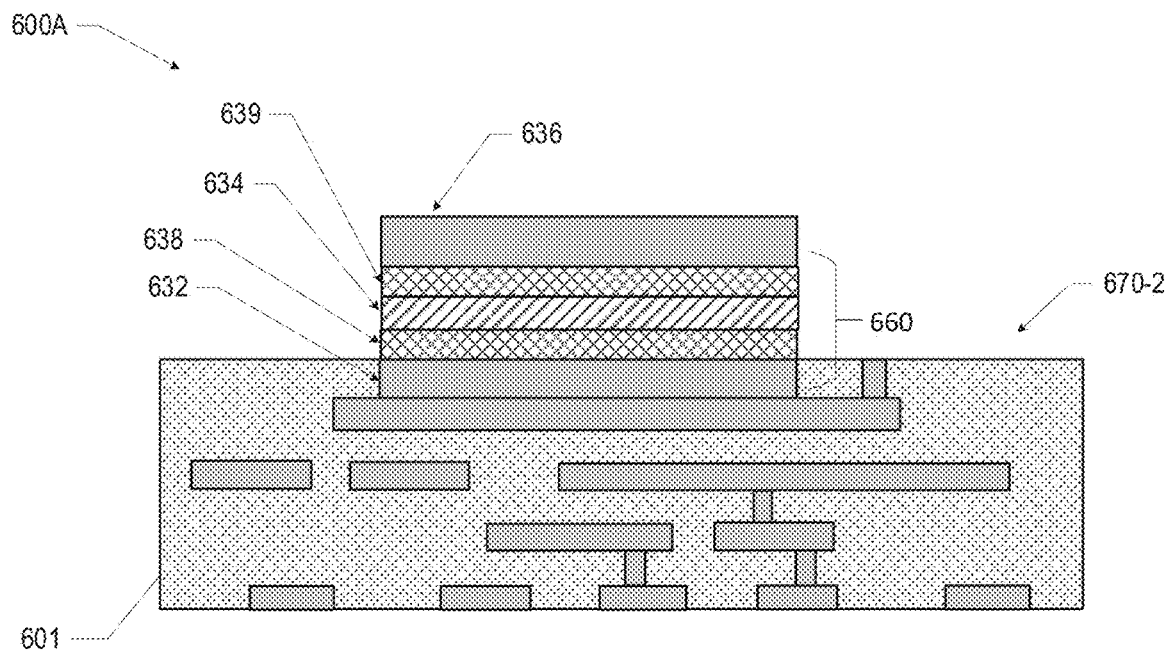
FIG. 6A is a side, cross-sectional view of a microelectronic assembly, in accordance with various embodiments.

FIG. 6A is a side, cross-sectional view of a microelectronic assembly 600A, in accordance with various embodiments. The microelectronic assembly 600A may include a package substrate 601 having an electronic component 660 integrated on the top surface 670-2 of the package substrate 601. For example, as shown in FIG. 6A, the electronic component 660 may be a capacitor having a first conductive layer 632 (e.g., a first electrode), a first perovskite conductive layer 638 that may function as part of the first electrode 632, a perovskite dielectric layer 634, a second perovskite conductive layer 639, and a second conductive layer 636 (e.g., a second electrode). In some embodiments, the crystal orientations of the first perovskite conductive layer 638, the second perovskite conductive layer 639, and the perovskite dielectric layer 634 may be the same. Although FIG. 6A shows a second perovskite conductive layer 639, this layer may be omitted or may be replaced with another conductive layer or layers.

Figure 6B:
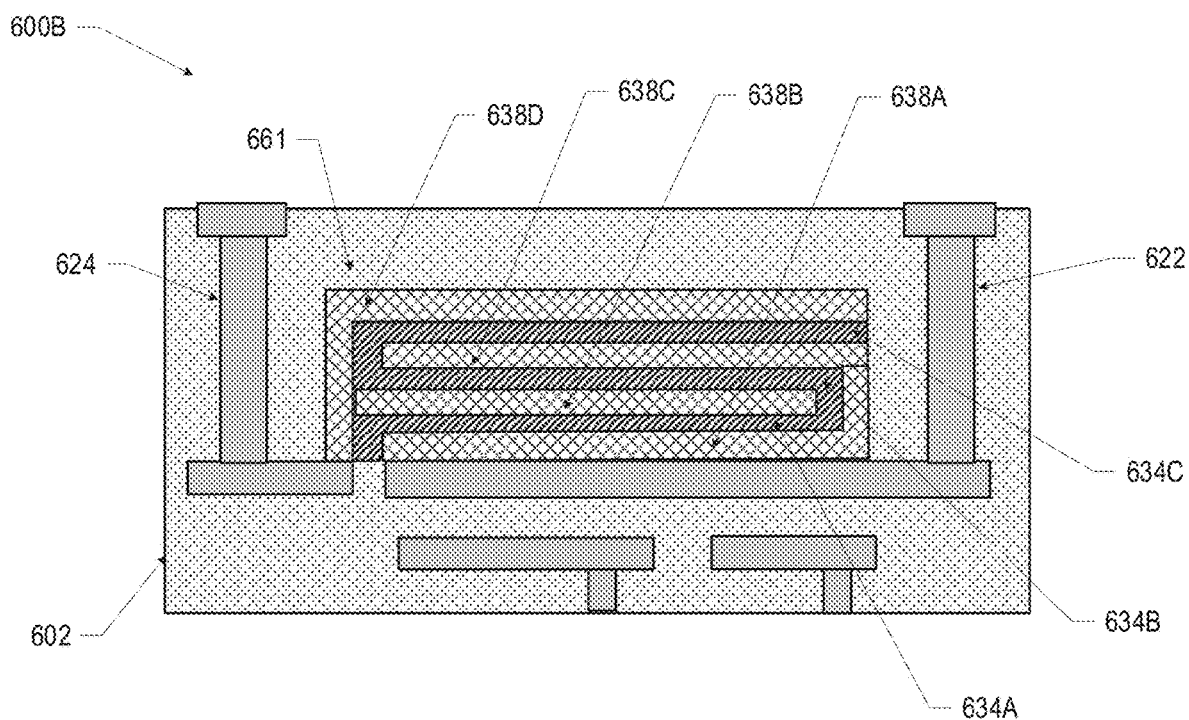
FIG. 6B is a side, cross-sectional view of a microelectronic assembly, in accordance with various embodiments.

FIG. 6B is a side, cross-sectional view of a microelectronic assembly 600B, in accordance with various embodiments. The microelectronic assembly 600B may include a package substrate 602 having an electronic component 661 embedded in the package substrate 602. For example, as shown in FIG. 6B, the electronic component 661 may be a multi-layered capacitor (e.g., stacked capacitor) having a first perovskite conductive layer 638A, a first perovskite dielectric layer 634A, a second perovskite conductive layer 638B, a second perovskite dielectric layer 634B, a third perovskite conductive layer 638C, a third perovskite dielectric layer 634C, and a fourth perovskite conductive layer 638D. The first and third perovskite conductive layers 638A, 638C may be coupled to through-via 622, and the second and fourth perovskite conductive layers 638B, 638D may be coupled to through-via 624. In some embodiments, the crystal orientations of all of the perovskite layers (i.e., perovskite conductive layers 638A-638D and perovskite dielectric layers 634A-634C) may be the same. In some embodiments, the crystal orientations of the perovskite layers (i.e., perovskite conductive layers 638A-638D and perovskite dielectric layers 634A-634C) may be different. Although FIG. 6B shows the perovskite conductive layers 638A-638D as single layers, in some embodiments, the perovskite conductive layers 638A-638D may include multiple layers and may include a metal layer, such as copper. In some embodiments, the perovskite dielectric layers 634A-634C may include multiple layers.

Figure 7:
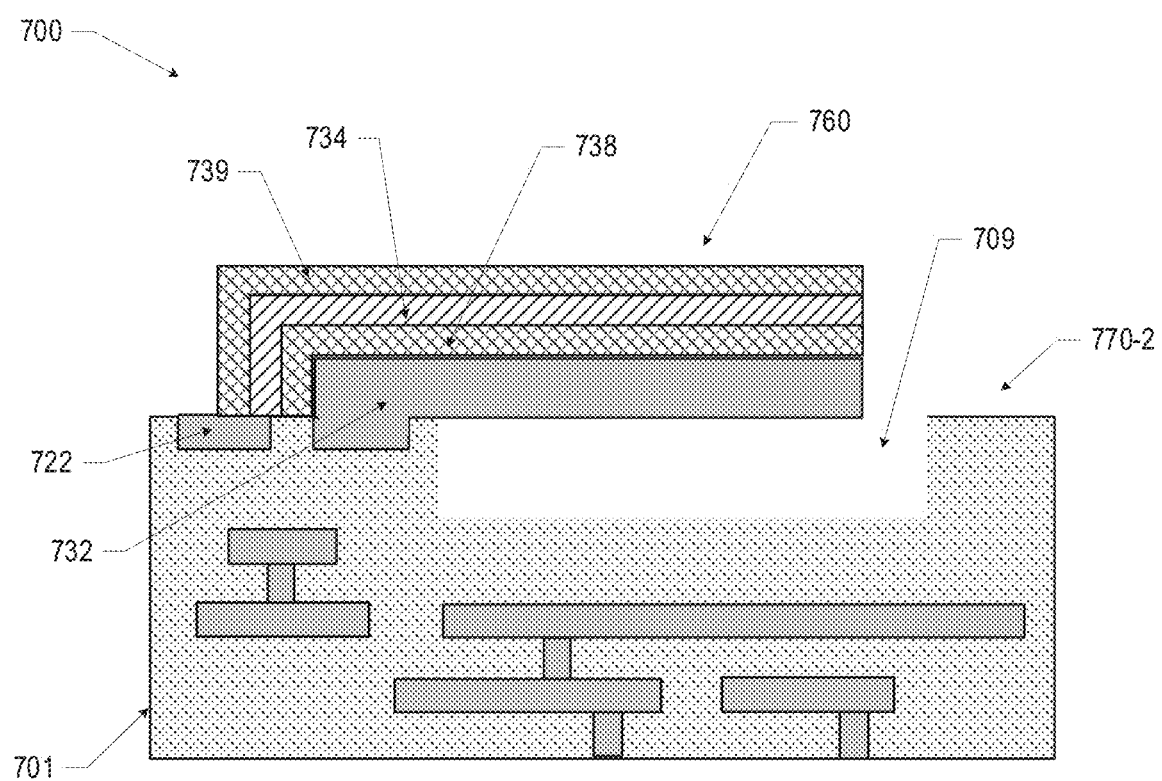
FIG. 7 is a side, cross-sectional view of a microelectronic assembly, in accordance with various embodiments.

FIG. 7 is a side, cross-sectional view of a microelectronic assembly 700, in accordance with various embodiments. The microelectronic assembly 700 may include a package substrate 701 having an electronic component 760 integrated on the top surface 770-2 of the package substrate 701. For example, as shown in FIG. 7, the electronic component 760 may be a cantilever sensor or actuator having a first conductive layer 732, a first perovskite conductive layer 738, a perovskite dielectric layer 734, and a second perovskite conductive layer 739 over an opening or a cavity 709 in the package substrate 701. The second perovskite conductive layer 739 may be coupled to conductive contact 722. In some embodiments, the crystal orientations of the first perovskite conductive layer 738, the second perovskite conductive layer 739, and the perovskite dielectric layer 734 may be different. In some embodiments, the crystal orientations of the first perovskite conductive layer 738, the second perovskite conductive layer 739, and the perovskite dielectric layer 734 may be the same. The opening 709 may be formed by boring out the dielectric material using, for example, reactive ion etching (RIE) or chemical etching. In some embodiments, the second perovskite conductive layer 739 may be replaced with another conductive layer, such as copper or other suitable metal. In other embodiments, another conductive layer may be added on top of the second perovskite conductive layer 739. Although FIG. 7 shows an example cantilever device, a device may have any suitable geometry.

Figures 8A, 8B:
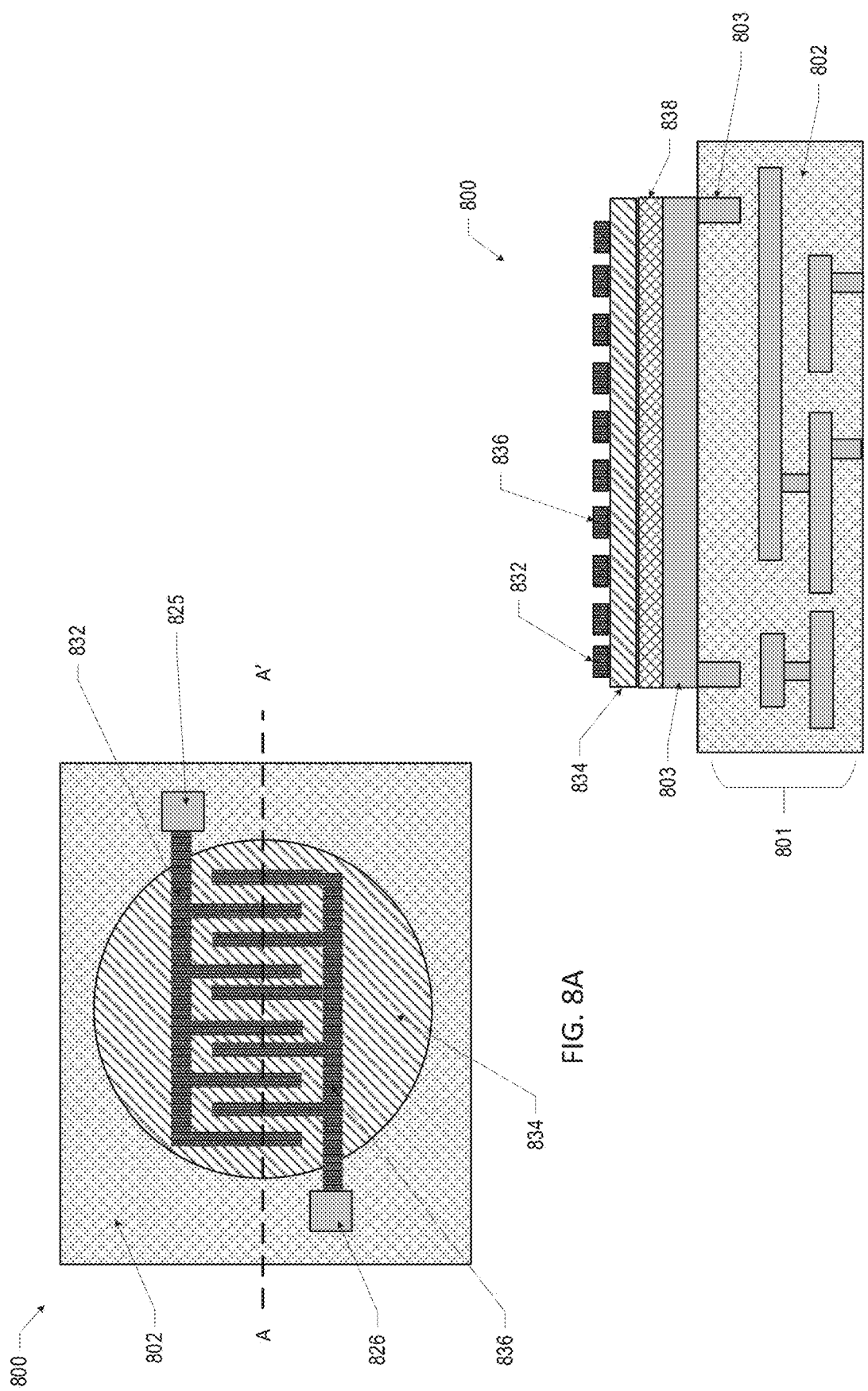
FIGS. 8A and 8B illustrate a top view and a side, cross-sectional view along the A-A' line, respectively, of a microelectronic assembly, in accordance with various embodiments.

FIGS. 8A and 8B illustrate a top view and a side, cross-sectional view along the A-A' line, respectively, of a microelectronic assembly 800 including an organic package substrate 801 with a first interdigitated electrode 832 and a second interdigitated electrode 836, in accordance with various embodiments. In particular, the package substrate 801 (e.g., organic substrate) may include a plurality of organic dielectric layers 802 and a plurality of conductive layers 803 that may include conductive connections 825, 826, a perovskite conductive layer 838, a perovskite dielectric layer 834, and the first and second interdigitated electrodes 832, 836, which may be formed during package substrate processing (e.g., at panel level). The plurality of organic dielectric layers 802 may be formed using any suitable material, such as described above with reference to FIG. 1. The plurality of conductive layers 803, which may include conductive pathways (e.g., conductive trace or via) and conductive connections 825, 826 in the package substrate may be formed using any suitable conductive material, such as a metal (e.g., copper), and any suitable process. The perovskite conductive layer 838 may be formed from any suitable conductive material having a perovskite crystalline structure, such as LNO or SRO and by any suitable process for forming a perovskite crystalline structure, including for example, the process described above with reference to FIG. 5. The perovskite dielectric layer 834 may be formed using any suitable dielectric material and any suitable process for forming a perovskite crystalline structure, including for example, the process described above with reference to FIG. 5. For example, the perovskite dielectric crystalline structure may be formed or grown on the perovskite conductive layer 838. The first and second interdigitated electrodes 832, 836 may be formed from any suitable conductive material. In some embodiments, the first and second interdigitated electrodes 832, 836 may be formed from a perovskite conductive material, such as LNO or SRO, and by any suitable process for forming a perovskite crystalline structure, including for example, the process described above with reference to FIG. 5. For example, the perovskite conductive crystalline structure forming the first and second interdigitated electrodes 832, 836 may be formed or grown on the perovskite dielectric layer 834. In some embodiments, the first or second interdigitated electrodes 832, 836 may be formed from a non-perovskite material, such as copper. As shown in FIG. 8A, the interdigitated electrodes 832, 836 may have a plurality of projections and a plurality of recesses. The interdigitated electrodes may be positioned to align the plurality projections of a first interdigitated electrode 832 with the plurality of recesses of a second interdigitated electrode 836 such that the plurality of projections of the first interdigitated electrode 832 alternate with the plurality of projections of the second interdigitated electrode 836. The interdigitated electrodes 832, 836 may be coupled to conductive connections 825, 826, which may provide mechanical support and/or an electrical connection to other conductive pathways in the package substrate. In some embodiments, the interdigitated electrodes 832, 836 may be part of an electronic component, such as a surface acoustic wave sensor or actuator, an ultrasonic transducer, a touch sensor, or a pressure sensing device.

FIGS. 9A and 9B illustrate a top view and a side, cross-sectional view along the B-B' line, respectively, of a microelectronic assembly 900 including an organic package substrate 901 with a first interdigitated electrode 932 and a second interdigitated electrode 936, in accordance with various embodiments. In particular, the package substrate 901 (e.g., organic substrate) may include a plurality of organic dielectric layers 902 and a plurality of conductive layers 903 that may include conductive connections 925, 926, a first perovskite conductive layer 938, a perovskite dielectric layer 934, a second perovskite conductive layer 939, and the first and second interdigitated electrodes 932, 936, which may be formed during package substrate processing (e.g., at panel level). The plurality of organic dielectric layers 902 may be formed using any suitable material, such as an organic dielectric material. The plurality of conductive layers 903, which may include conductive pathways (e.g., conductive trace or via) and conductive connections 925, 926 in the package substrate may be formed using any suitable conductive material, such as a metal (e.g., copper), and any suitable process. The first perovskite conductive layer 938 may be formed from any suitable conductive material having a perovskite crystalline structure, such as LNO or SRO, and by any suitable process for forming a perovskite crystalline structure, including for example, the process described above with reference to FIG. 5. The perovskite dielectric layer 934 may be formed using any suitable dielectric material and any suitable process for forming a perovskite crystalline structure, including for example, the process described above with reference to FIG. 5. The perovskite dielectric crystalline structure may be formed or grown on the first perovskite conductive layer 938. The second perovskite conductive layer 939 may be formed from any suitable conductive material having a perovskite crystalline structure, such as PZT or BST, and by any suitable process for forming a perovskite crystalline structure, including for example, the process described above with reference to FIG. 5. The second perovskite conductive layer 939 may be formed or grown on the perovskite dielectric layer 934. The second perovskite layer 939 may be patterned to match the shape of the first and second interdigitated electrodes 932, 936. The first and second interdigitated electrodes 932, 936 may be formed from any suitable conductive material, such as copper, for transporting current laterally. As shown in FIG. 9A, the interdigitated electrodes 932, 936 may have a plurality of projections and a plurality of recesses. The interdigitated electrodes may be positioned to align the plurality projections of a first interdigitated electrode 932 with the plurality of recesses of a second interdigitated electrode 936 such that the plurality of projections of the first interdigitated electrode 932 alternate with the plurality of projections of the second interdigitated electrode 936. The interdigitated electrodes 932, 936 may be coupled to conductive connections 925, 926, which may provide mechanical support and/or an electrical connection to other conductive pathways in the package substrate. In some embodiments, the interdigitated electrodes 932, 936 may be part of an electronic component, such as a surface acoustic wave sensor or actuator, an ultrasonic transducer, a touch sensor, or a pressure sensing device.

Figure 10:
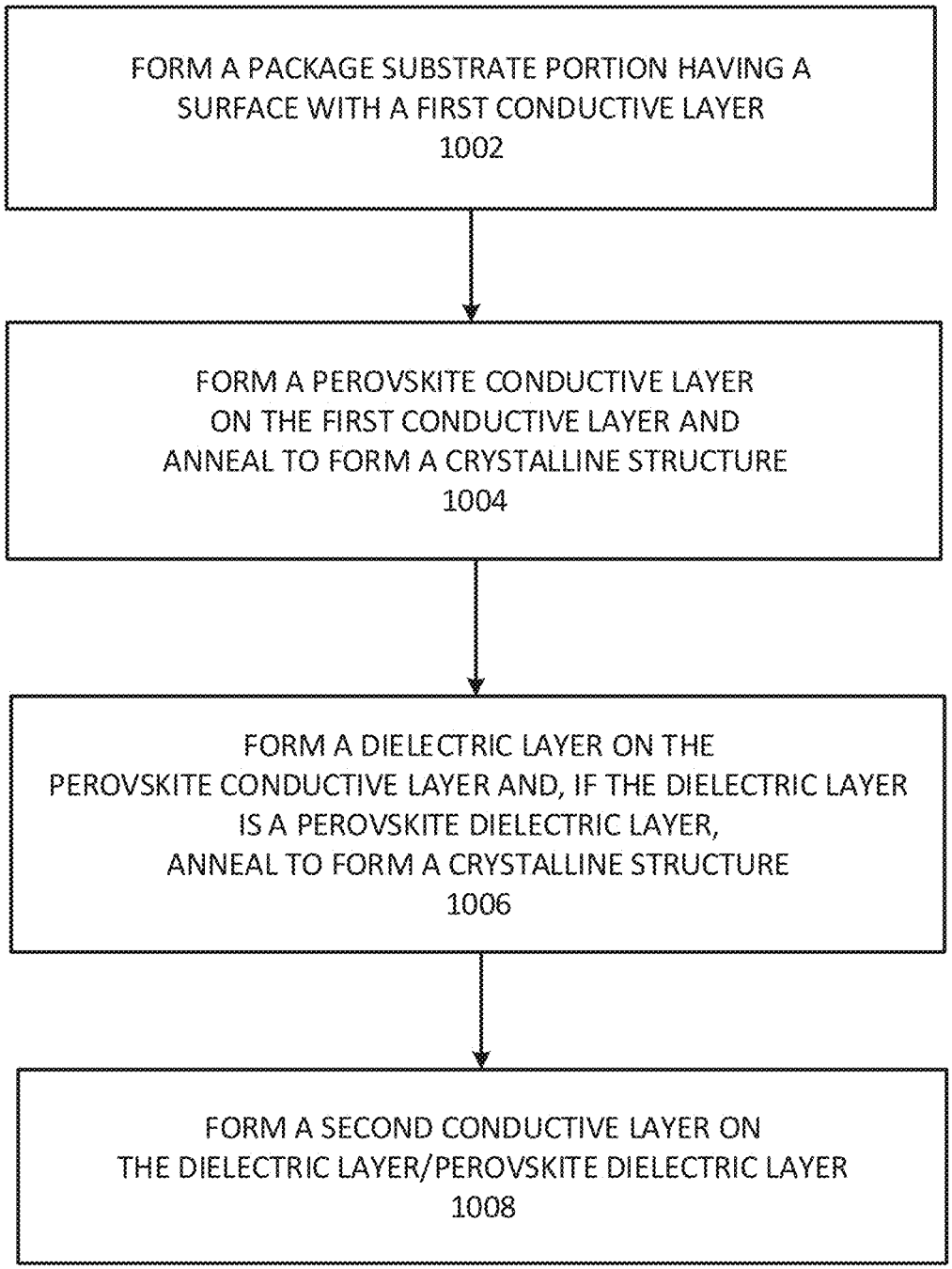
FIG. 10 is a process flow diagram of an example method of forming a microelectronic assembly having substrate-integrated perovskite conductive and dielectric layers, in accordance with various embodiments.

FIG. 10 is a process flow diagram of an example method of forming a microelectronic assembly having substrate-integrated perovskite conductive and dielectric layers, in accordance with various embodiments. At 1002, a portion of a package substrate may be formed. The package substrate portion may have a surface with a first conductive layer and may include an organic substrate. The surface of the package substrate portion may be the layer for integrating a perovskite conductive layer. The first conductive layer may be formed from a metal or a metal alloy. At 1004, a perovskite conductive layer may be formed on the first conductive layer and annealed to form a crystalline structure using, for example, a laser. At 1006, a dielectric layer may be formed on the perovskite conductive layer. In some embodiments, the dielectric layer may be formed using a non-perovskite dielectric material. In some embodiments, the dielectric layer may be formed using a perovskite dielectric material. A perovskite dielectric layer may be formed on the perovskite conductive layer and may be annealed to form a crystalline structure using, for example, a laser. In some embodiments, the perovskite dielectric layer may be nucleated from the perovskite conductive layer such that the perovskite dielectric crystals may align with the crystal orientation of the perovskite conductive layer. In some embodiments, the crystalline structure of the perovskite dielectric layer may not align with the crystal structure and may have a different orientation than the crystalline structure of the perovskite conductive layer. In some embodiments, a non-perovskite dielectric layer may be formed on the perovskite conductive layer, and the annealing process may be omitted. Optionally, at 1008, a second conductive layer may be formed on the perovskite dielectric layer. The second conductive layer may be formed from a metal or a metal alloy. Additional perovskite conductive and perovskite dielectric layers may be formed by repeating the process as described in 1002 through 1008.

Figure 11:
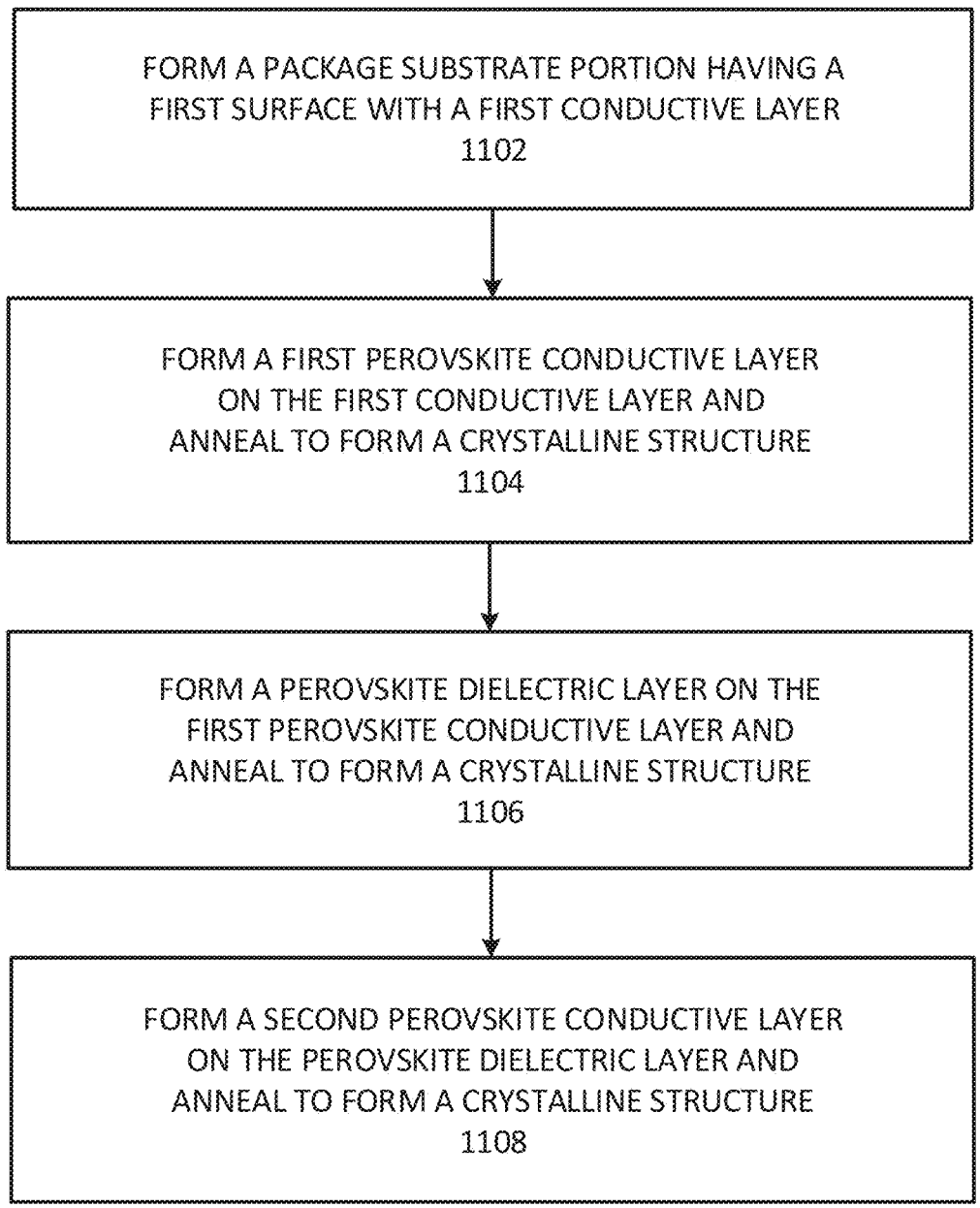
FIG. 11 is a process flow diagram of an example method of forming a microelectronic assembly having substrate-integrated perovskite conductive and dielectric layers, in accordance with various embodiments.

FIG. 11 is a process flow diagram of an example method of forming a microelectronic assembly having substrate-integrated perovskite conductive and dielectric layers, in accordance with various embodiments. At 1102, a portion of a package substrate may be formed. The package substrate portion may have a surface with a first conductive layer. The surface of the package substrate portion may be the layer for integrating a perovskite conductive layer. The first conductive layer may be formed from a metal or a metal alloy. At 1104, a first perovskite conductive layer may be formed on the first conductive layer and annealed to form a crystalline structure using, for example, a laser. At 1106, a perovskite dielectric layer may be formed on the first perovskite conductive layer and may be annealed to form a crystalline structure using, for example, a laser. In some embodiments, the perovskite dielectric layer may be nucleated from the first perovskite conductive layer such that the perovskite dielectric crystals align with the crystal orientation of the second perovskite conductive layer. In some embodiments, the crystalline structure of the perovskite dielectric layer may not align with the crystal orientation and may have a different orientation than the crystalline structure of the perovskite conductive layer. At 1008, a second perovskite conductive layer may be formed on the perovskite dielectric layer and annealed to form a second perovskite conductive crystalline structure using, for example, a laser. In some embodiments, the second perovskite conductive layer may be nucleated from the perovskite dielectric layer such that the perovskite crystals align with the crystal orientation of the perovskite dielectric layer. In some embodiments, the crystalline structure of the second perovskite conductive layer may not align and may have a different orientation than the crystalline structure of the perovskite dielectric layer. Additional perovskite conductive and perovskite dielectric layers may be formed by repeating the process as described in 1102 through 1108.

Figure 12:
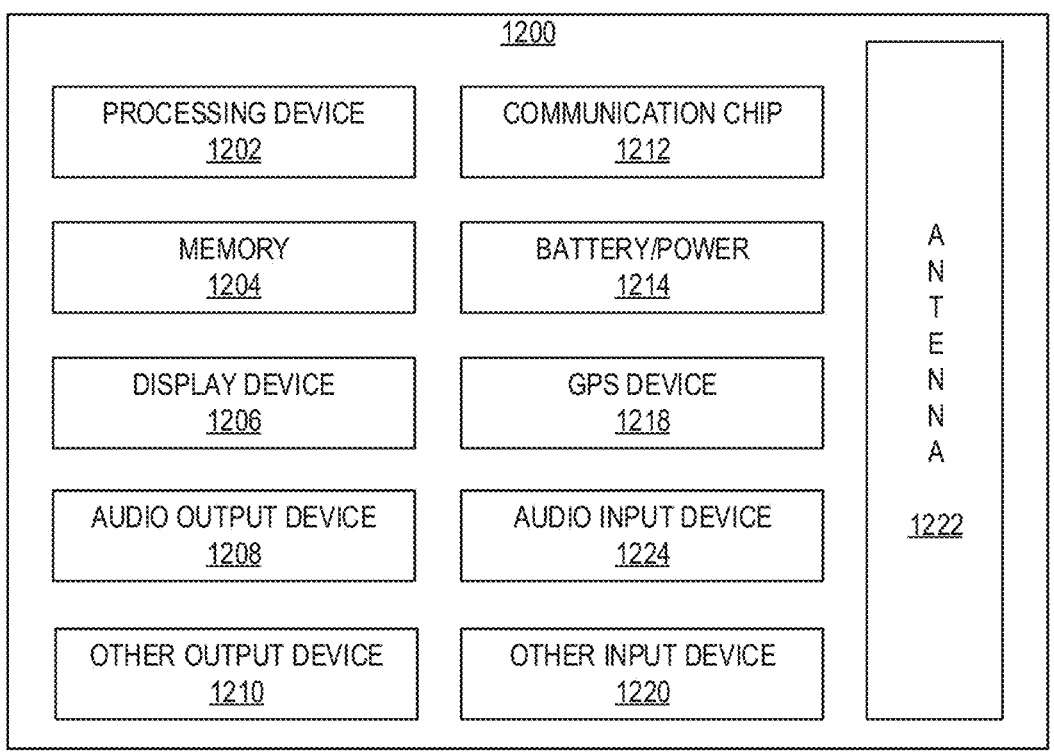
FIG. 12 is a block diagram of an example electrical device that may include a microelectronic assembly, in accordance with any of the embodiments disclosed herein.

The microelectronic assemblies disclosed herein may be included in any suitable electronic component. FIG. 12 is a block diagram of an example electrical device 1200, as referred to as a computing device, that may include one or more of the microelectronic assemblies disclosed herein. For example, any suitable ones of the components of the electrical device 1200 may include one or more of the microelectronic assemblies disclosed herein. A number of components are illustrated in FIG. 12 as included in the electrical device 1200, but any one or more of these components may be omitted or duplicated, as suitable for the application. In some embodiments, some or all of the components included in the electrical device 1200 may be attached to one or more motherboards. In some embodiments, some or all of these components are fabricated onto a single system-on-a-chip (SoC) die.

Additionally, in various embodiments, the electrical device 1200 may not include one or more of the components illustrated in FIG. 12, but the electrical device 1200 may include interface circuitry for coupling to the one or more components. For example, the electrical device 1200 may not include a display device 1206, but may include display device interface circuitry (e.g., a connector and driver circuitry) to which a display device 1206 may be coupled. In another set of examples, the electrical device 1200 may not include an audio input device 1224 or an audio output device 1208, but may include audio input or output device interface circuitry (e.g., connectors and supporting circuitry) to which an audio input device 1224 or audio output device 1208 may be coupled.

The electrical device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1204 may include memory that shares a die with the processing device 1202. This memory may be used as cache memory and may include embedded dynamic random access memory (eDRAM) or spin transfer torque magnetic random access memory (STT-MRAM).

In some embodiments, the electrical device 1200 may include a communication chip 1212 (e.g., one or more communication chips). For example, the communication chip 1212 may be configured for managing wireless communications for the transfer of data to and from the electrical device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1212 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other embodiments. The electrical device 1200 may include an antenna 1222 to facilitate wireless communications and/or to receive other wireless communications (such as AM or FM radio transmissions).

In some embodiments, the communication chip 1212 may manage wired communications, such as electrical, optical, or any other suitable communication protocols (e.g., the Ethernet). As noted above, the communication chip 1212 may include multiple communication chips. For instance, a first communication chip 1212 may be dedicated to shorter-range wireless communications such as Wi-Fi or Bluetooth, and a second communication chip 1212 may be dedicated to longer-range wireless communications such as global positioning system (GPS), EDGE, GPRS, CDMA, WiMAX, LTE, EV-DO, or others. In some embodiments, a first communication chip 1212 may be dedicated to wireless communications, and a second communication chip 1212 may be dedicated to wired communications.

The electrical device 1200 may include battery/power circuitry 1214. The battery/power circuitry 1214 may include one or more energy storage devices (e.g., batteries or capacitors) and/or circuitry for coupling components of the electrical device 1200 to an energy source separate from the electrical device 1200 (e.g., AC line power).

The electrical device 1200 may include a display device 1206 (or corresponding interface circuitry, as discussed above). The display device 1206 may include any visual indicators, such as a heads-up display, a computer monitor, a projector, a touchscreen display, a liquid crystal display (LCD), a light-emitting diode display, or a flat panel display.

The electrical device 1200 may include an audio output device 1208 (or corresponding interface circuitry, as discussed above). The audio output device 1208 may include any device that generates an audible indicator, such as speakers, headsets, or earbuds.

The electrical device 1200 may include an audio input device 1224 (or corresponding interface circuitry, as discussed above). The audio input device 1224 may include any device that generates a signal representative of a sound, such as microphones, microphone arrays, or digital instruments (e.g., instruments having a musical instrument digital interface (MIDI) output).

The electrical device 1200 may include a GPS device 1218 (or corresponding interface circuitry, as discussed above). The GPS device 1218 may be in communication with a satellite-based system and may receive a location of the electrical device 1200, as known in the art.

The electrical device 1200 may include another output device 1210 (or corresponding interface circuitry, as discussed above). Examples of the other output device 1210 may include an audio codec, a video codec, a printer, a wired or wireless transmitter for providing information to other devices, or an additional storage device.

The electrical device 1200 may include another input device 1220 (or corresponding interface circuitry, as discussed above). Examples of the other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1200 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1200 may be any other electronic device that processes data.

The following paragraphs provide various examples of the embodiments disclosed herein.

Example 1 is a microelectronic assembly, including: an organic package substrate portion having a conductive layer on a surface; a perovskite conductive layer having a first crystalline structure on the conductive layer; and a perovskite dielectric layer having a second crystalline structure on the perovskite conductive layer.

Example 2 may include the subject matter of Example 1, and may further specify that the second crystalline structure has a same orientation as the first crystalline structure.

Example 3 may include the subject matter of Example 1, and may further specify that the second crystalline structure has a different orientation than the first crystalline structure.

Example 4 may include the subject matter of Example 1, and may further specify that the first crystalline structure has a single orientation.

Example 5 may include the subject matter of Example 4, and may further specify that the first crystalline structure has a (100) orientation.

Example 6 may include the subject matter of Example 4, and may further specify that the first crystalline structure has a (110) orientation.

Example 7 may include the subject matter of Example 1, and may further specify that the first crystalline structure has more than one orientation.

Example 8 may include the subject matter of Example 1, and may further specify that the perovskite conductive layer is a first perovskite conductive layer, and may further include: a second perovskite conductive layer having a third crystalline structure on the perovskite dielectric layer, wherein the perovskite dielectric layer is between the first and second perovskite conductive layers.

Example 9 may include the subject matter of Example 8, and may further specify that the third crystalline structure has a same orientation as the second crystalline structure.

Example 10 may include the subject matter of Example 8, and may further specify that the third crystalline structure has a different orientation than the second crystalline structure.

Example 11 is a microelectronic assembly, including: an organic package substrate portion having a conductive layer on a surface; and an electronic component, wherein the electronic component includes one of a capacitor, an actuator, an accelerometer, a transducer, a sensor, and a resistor, and wherein the electronic component includes: a perovskite conductive layer on the conductive layer on the surface of the organic package substrate portion.

Example 12 may include the subject matter of Example 11, and may further specify that the perovskite conductive layer has a first crystalline structure, and wherein the electronic component further includes: a perovskite dielectric layer having a second crystalline structure on the perovskite conductive layer.

Example 13 may include the subject matter of Example 12, and may further specify that the first crystalline structure has a same orientation as the second crystalline structure.

Example 14 may include the subject matter of Example 12, and may further specify that the first crystalline structure has a different orientation than the second crystalline structure.

Example 15 may include the subject matter of Example 11, and may further specify that the first crystalline structure has a single orientation.

Example 16 may include the subject matter of Example 15, and may further specify that the first crystalline structure has a (100) orientation.

Example 17 may include the subject matter of Example 15, and may further specify that the first crystalline structure has a (110) orientation.

Example 18 may include the subject matter of Example 11, and may further specify that the first crystalline structure has more than one orientation.

Example 19 may include the subject matter of Example 12, and may further specify that the perovskite conductive layer is a first perovskite conductive layer, and the electronic component further includes: a second perovskite conductive layer having a third crystalline structure on the perovskite dielectric layer, wherein the perovskite dielectric layer is between the first and second perovskite conductive layers.

Example 20 may include the subject matter of Example 19, and may further specify that the third crystalline structure has a same orientation as the second crystalline structure.

Example 21 may include the subject matter of Example 19, and may further specify that the third crystalline structure has a different orientation than the second crystalline structure.

Example 22 may include the subject matter of Example 12, and may further specify that the electronic component further includes: a second conductive layer on the perovskite dielectric layer, wherein the perovskite dielectric layer is between the perovskite conductive layer and the second conductive layer.

Example 23 may include the subject matter of Example 22, and may further specify that the electronic component is a capacitor, and wherein the perovskite conductive layer is a first electrode and the second conductive layer is a second electrode.

Example 24 may include the subject matter of Example 23, and may further specify that the electronic component is an embedded capacitor.

Example 25 may include the subject matter of Example 12, and may further specify that the electronic component is a stacked capacitor, and wherein the perovskite conductive layer is a first perovskite conductive layer and the perovskite dielectric layer is a first perovskite dielectric layer, the electronic component further including: a second perovskite conductive layer having a third crystalline structure on the first perovskite dielectric layer; and a second perovskite dielectric layer having a fourth crystalline structure on the second perovskite conductive layer.

Example 26 may include the subject matter of Example 25, and may further specify that the second crystalline structure has a same orientation as the first crystalline structure.

Example 27 may include the subject matter of Example 25, and may further specify that the second crystalline structure has a different orientation than the first crystalline structure.

Example 28 is a method of manufacturing a microelectronic assembly, including: forming an organic package substrate portion having a conductive layer on a surface; forming a perovskite conductive layer on the conductive layer; and annealing the perovskite conductive layer to form a first crystalline structure.

Example 29 may include the subject matter of Example 28, and may further include: forming a perovskite dielectric layer on the perovskite conductive layer; and annealing the perovskite dielectric layer to form a second crystalline structure.

Example 30 may include the subject matter of Example 29, and may further specify that the second crystalline structure has a same orientation as the first crystalline structure.

Example 31 may include the subject matter of Example 29, and may further specify that the second crystalline structure has a different orientation than the first crystalline structure.

Example 32 may include the subject matter of Example 29, and may further specify that the perovskite conductive layer is a first perovskite conductive layer, and may further include: forming a second perovskite conductive layer on the perovskite dielectric layer, wherein the perovskite dielectric layer is between the first and second perovskite conductive layers; and annealing the second perovskite conductive layer to form a third crystalline structure.

Example 33 may include the subject matter of Example 29, and may further specify that the conductive layer on the surface of the organic package substrate portion is a first conductive layer, and may further include: forming a second conductive layer on the perovskite dielectric layer, wherein the perovskite dielectric layer is between the perovskite conductive layer and the second conductive layer.

Example 34 may include the subject matter of Example 33, and may further specify that forming the second conductive layer includes: depositing a photoresist layer on the perovskite dielectric layer; forming an opening in the photoresist layer; depositing conductive material in the opening; and removing the photoresist layer.

Example 35 may include the subject matter of Example 34, and may further specify that forming the second conductive layer further includes: depositing a seed layer on the perovskite dielectric layer before depositing the photoresist layer.

Example 36 may include the subject matter of Example 28, and may further specify that annealing the perovskite conductive layer is a pulsed laser annealing.

Example 37 is a computing device, including: a circuit board; and an integrated circuit (IC) package coupled to the circuit board, wherein the IC package includes: an organic package substrate portion having a conductive layer on a surface; and an electronic component, wherein the electronic component includes one of a capacitor, an actuator, an accelerometer, a transducer, a sensor, and a resistor, and wherein the electronic component includes: a perovskite conductive layer having a first crystalline structure on the conductive layer on the surface of the organic package substrate portion; and a perovskite dielectric layer having a second crystalline structure on the perovskite conductive layer.

Example 38 may include the subject matter of Example 37, and may further specify that the second crystalline structure has a same orientation as the first crystalline structure.

Example 39 may include the subject matter of Example 37, and may further specify that the second crystalline structure has a different orientation than the first crystalline structure.

Example 40 may include the subject matter of Example 37, and may further specify that the first crystalline structure has a single orientation.

Example 41 may include the subject matter of Example 37, and may further specify that the first crystalline structure has a (100) orientation.

Example 42 may include the subject matter of Example 37, and may further specify that the first crystalline structure has a (110) orientation.

Example 43 may include the subject matter of Example 37, and may further specify that the first crystalline structure has more than one orientation.

Example 44 may include the subject matter of Example 37, and may further specify that the electronic component further includes: a second conductive layer on the perovskite dielectric layer, wherein the perovskite dielectric layer is between the perovskite conductive layer and the second conductive layer.

Example 45 may include the subject matter of Example 44, and may further specify that the electronic component includes a first interdigitated electrode and a second interdigitated electrode, and wherein the second perovskite conductive layer is patterned to match the first interdigitated electrode and the second interdigitated electrode.

Example 46 may include the subject matter of Example 45, and may further specify that the electronic component is a sensor or an actuator.

Example 47 may include the subject matter of Example 37, and may further specify that the perovskite conductive layer is a first perovskite conductive layer, and the electronic component further includes: a second perovskite conductive layer having a third crystalline structure on the perovskite dielectric layer, wherein the perovskite dielectric layer is between the first and second perovskite conductive layers.

Example 48 may include the subject matter of Example 47, and may further specify that the third crystalline structure has a same orientation as the second crystalline structure.

Example 49 may include the subject matter of Example 47, and may further specify that the third crystalline structure has a different orientation than the second crystalline structure.

Example 50 may include the subject matter of Example 37, and may further specify that the circuit board is a motherboard.

Example 51 may include the subject matter of Example 37, and may further specify that the computing device is a smartphone.

Example 52 may include the subject matter of Example 37, and may further specify that the computing device is a tablet computing device.

The invention claimed is:

1. A microelectronic assembly, comprising:
a package substrate portion including an organic dielectric material and a stacked structure in the organic dielectric material, wherein the stacked structure comprises:
a first layer including a conductive material;
a second layer on the first layer, the second layer including a perovskite conductive material having a first crystalline structure;
a third layer on the second layer, the third layer including a perovskite dielectric material having a second crystalline structure; and
a fourth layer on the third layer, the fourth layer including the conductive material.

2. The microelectronic assembly of claim 1, wherein the second crystalline structure has a same orientation as the first crystalline structure.

3. The microelectronic assembly of claim 1, wherein the second crystalline structure has a different orientation than the first crystalline structure.

4. The microelectronic assembly of claim 1, wherein the first crystalline structure has a single orientation.

5. The microelectronic assembly of claim 1, wherein the first crystalline structure has more than one orientation.

6. The microelectronic assembly of claim 1, wherein the second layer includes a first perovskite conductive material, and the stacked structure further comprises:
a fifth layer between the third layer and the fourth layer, the fifth layer including a second perovskite conductive material having a third crystalline structure, wherein the perovskite dielectric material is between the first and second perovskite conductive materials.

7. The microelectronic assembly of claim 4, wherein the first crystalline structure has a (100) orientation.

8. The microelectronic assembly of claim 4, wherein the first crystalline structure has a (110) orientation.

9. The microelectronic assembly of claim 6, wherein the third crystalline structure has a same orientation as the second crystalline structure.

10. The microelectronic assembly of claim 6, wherein the third crystalline structure has a different orientation than the second crystalline structure.

11. A microelectronic assembly, comprising: a package substrate portion having a surface and including an organic dielectric material; and an electronic component having a stacked structure, wherein the electronic component includes one of a capacitor, an actuator, an accelerometer, a transducer, a sensor, and a resistor, and wherein the stacked structure of the electronic component comprises: a first layer on the surface of the package substrate portion, the first layer including a conductive material; and a second layer on the first layer, the second layer including a perovskite conductive material; wherein the perovskite conductive material has a first crystalline structure, and wherein the stacked structure of the electronic component further comprises: a third layer on the second layer, the third layer including a perovskite dielectric material having a second crystalline structure.

12. The microelectronic assembly of claim 11, wherein the first crystalline structure has a same orientation as the second crystalline structure.

13. The microelectronic assembly of claim 11, wherein the first crystalline structure has a different orientation than the second crystalline structure.

14. The microelectronic assembly of claim 11, wherein the second layer includes a first perovskite conductive material, and wherein the stacked structure of the electronic component further comprises:
a fourth layer on the third layer, the fourth layer including a second perovskite conductive material having a third crystalline structure.

15. The microelectronic assembly of claim 11, wherein the stacked structure of the electronic component further comprises:
a fourth layer on the third layer, the fourth layer including the conductive material.

16. The microelectronic assembly of claim 11, wherein the electronic component is a stacked capacitor, wherein the second layer includes a first perovskite conductive material, wherein the third layer includes a first perovskite dielectric material, and wherein the stacked structure of the electronic component further comprises:
a fourth layer on the third layer, the fourth layer including a second perovskite conductive material having a third crystalline structure; and
a fifth layer on the fourth layer, the fifth layer including a second perovskite dielectric layer having a fourth crystalline structure.

17. The microelectronic assembly of claim 14, wherein the third crystalline structure has a same orientation as the second crystalline structure.

18. The microelectronic assembly of claim 15, wherein the electronic component is a capacitor, and wherein the second layer is a first electrode and the fourth layer is a second electrode.

19. A computing device, comprising: a circuit board; and an integrated circuit (IC) package coupled to the circuit board, wherein the IC package includes: a package substrate portion having a surface; and an electronic component having a stacked structure, wherein the electronic component includes one of a capacitor, an actuator, an accelerometer, a transducer, a sensor, and a resistor, and wherein the stacked structure of the electronic component comprises: a first layer on the surface of the package substrate portion, the first layer including a conductive material; a second layer on the first layer, the second layer including a perovskite conductive material having a first crystalline structure; and a third layer on the second layer, the third layer including a perovskite dielectric material having a second crystalline structure; and a fourth layer on the third layer, the fourth layer including the conductive material.

20. The computing device of claim 19, wherein the perovskite conductive material of the second layer is a first perovskite conductive material, wherein the fourth layer of the electronic component includes a first interdigitated electrode and a second interdigitated electrode, and wherein the stacked structure of the electronic component further comprises:
a fifth layer between the third layer and the fourth layer, wherein the fifth layer includes a second perovskite conductive material, and wherein the second perovskite conductive material is patterned to match the first interdigitated electrode and the second interdigitated electrode.

* * * * *